US009214474B2

(12) United States Patent
Yamazaki

(10) Patent No.: US 9,214,474 B2
(45) Date of Patent: Dec. 15, 2015

(54) SEMICONDUCTOR DEVICE AND METHOD FOR MANUFACTURING SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 212 days.

(21) Appl. No.: 13/535,506

(22) Filed: Jun. 28, 2012

(65) Prior Publication Data
US 2013/0009209 A1 Jan. 10, 2013

(30) Foreign Application Priority Data

Jul. 8, 2011 (JP) .................................. 2011-152096

(51) Int. Cl.
| | | |
|---|---|---|
| H01L 29/78 | (2006.01) | |
| H01L 27/12 | (2006.01) | |
| H01L 29/786 | (2006.01) | |

(52) U.S. Cl.
CPC ........ *H01L 27/1225* (2013.01); *H01L 29/7869* (2013.01); *H01L 29/78603* (2013.01); *H01L 29/78696* (2013.01)

(58) Field of Classification Search
CPC ............ H01L 27/1225; H01L 27/1229; H01L 29/78693; H01L 29/78696; H01L 29/78687
USPC ................ 257/43, 40, 288, 192, 57, E21.409, 257/E29.068, E21.476; 438/104
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,207,969 B1 | 3/2001 | Yamazaki |
| 6,294,274 B1 | 9/2001 | Kawazoe et al. |
| 6,563,174 B2 | 5/2003 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Kenneth Parker
*Assistant Examiner* — Bo Fan
(74) *Attorney, Agent, or Firm* — Eric J. Robinson; Robinson Intellectual Property Law Office, P.C.

(57) ABSTRACT

To provide a transistor including an oxide semiconductor layer and having electric characteristics required depending on an intended use and provide a semiconductor device including the transistor, in a transistor in which a semiconductor layer, source and drain electrode layers, a gate insulating film, and a gate electrode are stacked in this order over an oxide semiconductor insulating film, an oxide semiconductor stack layer which includes at least two oxide semiconductor layers with energy gaps different from each other and a mixed region therebetween is used as the semiconductor layer.

10 Claims, 18 Drawing Sheets

(56) References Cited

U.S. PATENT DOCUMENTS

| | | | |
|---|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,421,083 B2 | 4/2013 | Yamazaki et al. |
| 8,492,757 B2 | 7/2013 | Sakata et al. |
| 8,748,886 B2 | 6/2014 | Yamazaki et al. |
| 8,872,175 B2 | 10/2014 | Sakata et al. |
| 8,916,867 B2 | 12/2014 | Koezuka |
| 8,916,870 B2 | 12/2014 | Sakata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308804 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236596 A1 | 9/2009 | Itai |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2009/0321732 A1 | 12/2009 | Kim et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0163866 A1 | 7/2010 | Akimoto et al. |
| 2010/0163868 A1 | 7/2010 | Yamazaki et al. |
| 2011/0012105 A1* | 1/2011 | Yamazaki et al. ............... 257/43 |
| 2011/0024751 A1 | 2/2011 | Yamazaki et al. |
| 2011/0114947 A1* | 5/2011 | Iwasaki .......................... 257/43 |
| 2011/0127522 A1 | 6/2011 | Yamazaki |
| 2011/0127523 A1 | 6/2011 | Yamazaki |
| 2011/0140100 A1 | 6/2011 | Takata et al. |
| 2011/0157131 A1* | 6/2011 | Miyake ....................... 345/211 |
| 2011/0168997 A1* | 7/2011 | Lee et al. ..................... 257/57 |
| 2012/0168743 A1* | 7/2012 | Lee et al. ..................... 257/43 |
| 2012/0319102 A1 | 12/2012 | Yamazaki et al. |
| 2012/0319114 A1 | 12/2012 | Yamazaki et al. |
| 2012/0319183 A1 | 12/2012 | Yamazaki et al. |
| 2013/0009219 A1 | 1/2013 | Yamazaki et al. |
| 2013/0228777 A1 | 9/2013 | Yamazaki et al. |
| 2015/0102347 A1 | 4/2015 | Koezuka |
| 2015/0137119 A1 | 5/2015 | Sakata et al. |

FOREIGN PATENT DOCUMENTS

| | | |
|---|---|---|
| GB | 2 153 589 | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2007-096055 | 4/2007 |

(56) References Cited

FOREIGN PATENT DOCUMENTS

WO  WO-2004/114391  12/2004
WO  2009/072532  6/2009

OTHER PUBLICATIONS

Dembo.H et al., "RFCPUS on Glass and Plastic Substrates Fabricated by TFT Transfer Technology,", IEDM 05: Technical Digest of International Electron Devices Meeting Dec. 5, 2005, pp. 1067-1069.
Ikeda.T et al., "Full-Functional System Liquid Crystal Display Using CG-Silicon Technology, ", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of SOL-GEL Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO(Ga2O3-In2O3-ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Disgest of Technical Papers, Jul. 1, 2009, pp. 227-230, The Japan Society of Applied Physics.
Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane,", SID Digest '09 : SID International Symposium Digest of Technical Papers, May, 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.
Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID

(56) References Cited

OTHER PUBLICATIONS

Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds In the In2O3 and SC2O3-A2O3-BO Systems [A; Fe, Ga, Or Al; B: Mg, Mn, Fe, Ni, Cu, Or Zn]at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Phyiscal Review Letters), May 4, 1981, vol. 46, No. 18, pp. 1216-1219.

Park.Sang-Hee et al., "42.3: Transparent ZnO Thin Film Transistrs for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc—Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Disgest '08 : SID International Symposium Disgest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214TH ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Phyiscal Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B) Mar. 1, 2003, vol. 21, No. 2, pp. 800-803.

Oh.M et al., "Improving the Gate Stability of ZnO Thin-Film Transistors With Aluminum Oxide Dieletric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Morosawa et al., "35.3: Distinguished Paper: A Novel Self-Aligned Top-Gate Oxide TFT for AM-OLED Displays," SID Digest '11: SID International Symposium Digest of Technical Papers, May 17, 2011, pp. 479-482.

Ono et al., "Novel High Performance IGZO-TFT with High Mobility over 40 $cm^2$/Vs and High Photostability Incorporated Oxygen Diffusion," IDW '11: Proceedings of the $18^{th}$ International Display Workshops, Dec. 7, 2011, pp. 1689-1690.

\* cited by examiner

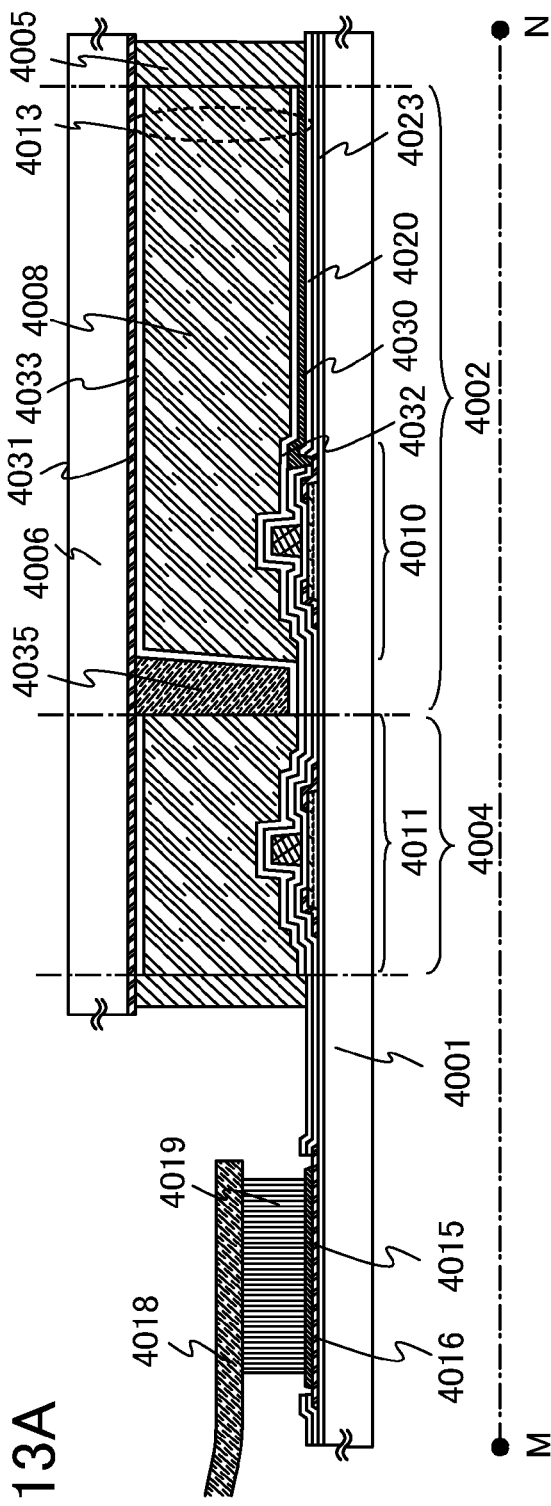
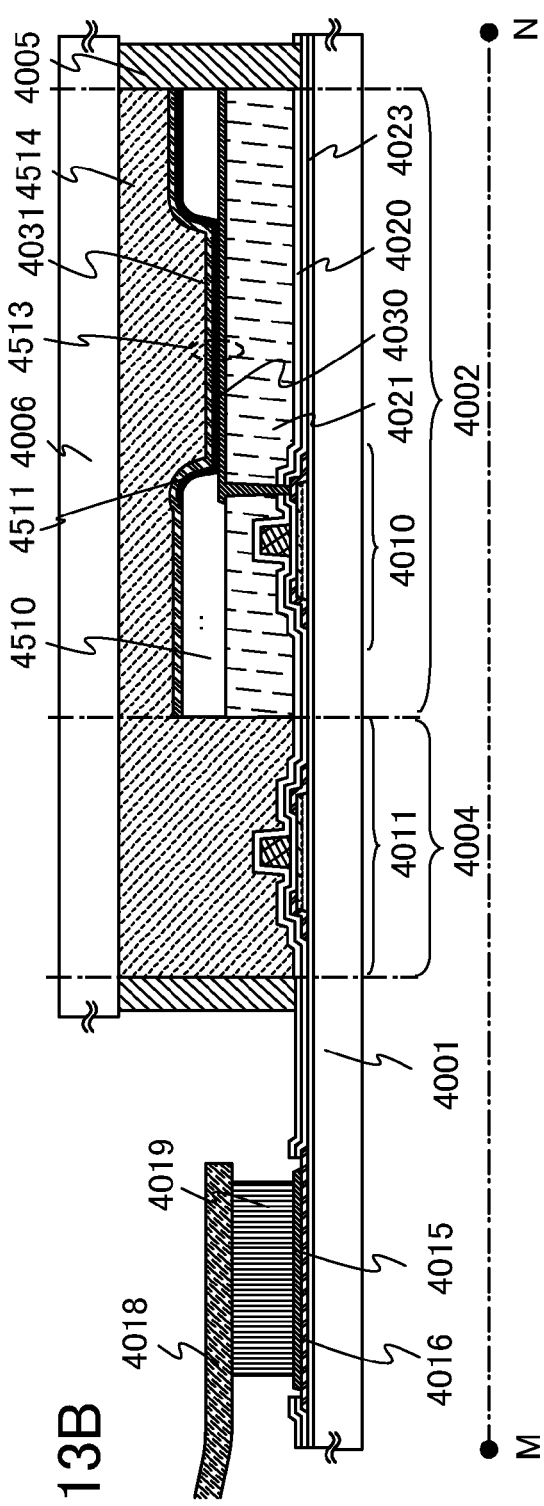
FIG. 13A
FIG. 13B

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally refers to a device which can function by utilizing semiconductor characteristics; an electro-optical device, a semiconductor circuit, and an electronic device are all included in the category of the semiconductor device.

2. Description of the Related Art

A technique by which transistors (also referred to as thin film transistors (TFTs)) are formed using semiconductor thin films formed over a substrate having an insulating surface has been attracting attention. The transistor is applied to a wide range of electronic devices such as an integrated circuit (IC) or an image display device (display device). As materials of semiconductor thin films applicable to the transistors, silicon-based semiconductor materials have been widely used, but oxide semiconductors have been attracting attention as alternative materials.

For example, disclosure is made of a transistor whose active layer is formed using an amorphous oxide containing indium (In), gallium (Ga), and zinc (Zn) (see Patent Document 1).

REFERENCE

[Patent Document 1] Japanese Published Patent Application No. 2006-165528

SUMMARY OF THE INVENTION

An improvement in on-state characteristics (e.g., on-state current and field effect mobility) of a transistor leads to high-speed response to an input signal and high-speed operation of a semiconductor device; thus, a semiconductor device with higher performance can be achieved. On the other hand, a sufficiently low off-state current is needed to reduce power consumption of a semiconductor device. That is, required electric characteristics of a transistor vary with uses and purposes of the transistor, and it is profitable to control the electric characteristics more precisely.

One object of one embodiment of the present invention is to provide a structure of a transistor including an oxide semiconductor in a channel formation region, which achieves a so-called normally-off switching element whose threshold voltage which is one of electric characteristics of a transistor can be positive, and to provide a manufacturing method thereof.

It is preferable that the threshold voltage of a transistor, at which a channel is formed, be a positive gate voltage as close to 0 V as possible. If the threshold voltage of the transistor is negative, the transistor tends to be in a so-called normally-on state, in which current flows between a source electrode and a drain electrode even when the gate voltage is 0 V. For an LSI, a CPU or a memory, electric characteristics of transistors included in a circuit are important and the electric characteristics affect power consumption of a semiconductor device. In particular, of the electric characteristics of the transistor, the threshold voltage ($V_{th}$) is important. When the threshold voltage is negative even while the field effect mobility is high, it is difficult to control the circuit. Such a transistor in which a channel is formed even at a negative voltage so that a drain current flows is not suitable as a transistor used in an integrated circuit of a semiconductor device.

Further, it is important that the characteristics of a transistor be close to the normally-off characteristics even when the transistor is not a normally-off transistor depending on the material or the manufacturing condition. It is an object of one embodiment of the present invention to provide a structure for achieving a threshold voltage of a transistor, which is made to be close to zero even when the transistor is a so-called normally-on transistor whose threshold voltage is negative, and to provide a manufacturing method thereof.

Further, another object of one embodiment of the present invention is to provide a structure of a semiconductor device which achieves high-speed response and high-speed operation by improving on-state characteristics (e.g., on-state current or field-effect mobility) of a transistor, and to provide a manufacturing method thereof, in order to achieve a high-performance semiconductor device.

Another object of one embodiment of the present invention is to provide a transistor including an oxide semiconductor layer and having electric characteristics required depending on an intended use, and to provide a semiconductor device including the transistor.

It is an object of one embodiment of the present invention to achieve at least one of the above-described objects.

In a transistor in which a semiconductor layer, source and drain electrode layers, a gate insulating film, and a gate electrode are stacked in this order, an oxide semiconductor stack which includes at least two oxide semiconductor layers with energy gaps different from each other and a mixed region therebetween is used as the semiconductor layer.

In an oxide semiconductor stack disclosed in this specification, the interface between stacked oxide semiconductor layers is unclear, and the oxide semiconductor stack includes a portion that can be referred to as a mixed region or a mixed layer between the plurality of different oxide semiconductor layers. Note that when the interface is unclear, a continuous boundary cannot be observed between the oxide semiconductor layers in a cross-sectional observation image (TEM image) of the oxide semiconductor stack, which is taken using a high resolution transmission electron microscope.

The mixed region is a region where elements included in the stacked oxide semiconductor layers are mixed, and at least the composition (composition ratio) of elements included in the mixed region is different from that included in the stacked oxide semiconductor layers. For example, in the case where the oxide semiconductor stack has a layered structure of a first oxide semiconductor layer including indium, tin, and zinc and a second oxide semiconductor layer including indium, gallium, and zinc, a mixed region including indium, tin, gallium, and zinc can be formed between the first oxide semiconductor layer and the second oxide semiconductor layer. In addition, even in the case where elements included in the first oxide semiconductor layer and the second oxide semiconductor layer are the same, a mixed region whose composition (composition ratio) is different can be formed.

The energy gap of the mixed region is different from those of the oxide semiconductor layers between which the mixed region is provided, and the energy gap of the mixed region is a value between the energy gaps of the oxide semiconductor layers between which the mixed region is provided. Thus, when the mixed region is provided between the stacked oxide semiconductor layers with energy gaps different from each other in the oxide semiconductor stack, a region between the first oxide semiconductor layer and the second oxide semiconductor layer has a continuous energy band in the energy band diagram.

The mixed region can be formed by performing heat treatment on the oxide semiconductor stack including a plurality of oxide semiconductor layers. The heat treatment is performed at a temperature at which the elements in the stacked oxide semiconductor layers can be diffused by heat under such a condition that the stacked oxide semiconductor layers do not form the mixed region whose composition (composition ratio) is uniform in the entire region of the oxide semiconductor stack.

With the mixed region, less interface scattering occurs in the stacked oxide semiconductor layers and the field-effect mobility of the transistor can be improved.

In the case where the oxide semiconductor stack is a layered structure of a first oxide semiconductor layer and a second oxide semiconductor layer, the energy gaps of the first oxide semiconductor layer and the second oxide semiconductor layer are different from each other, and the stack order thereof is not limited. One of the oxide semiconductor layers which is in contact with the gate insulating film may have either a larger energy gap or a smaller energy gap than the other.

Specifically, in the oxide semiconductor stack, the energy gap of one oxide semiconductor layer is larger than or equal to 3 eV, and an energy gap of the other oxide semiconductor layer is smaller than 3 eV. Note that in this specification, the term "energy gap" is used to mean the terms "band gap" and "forbidden band gap".

In the case where the oxide semiconductor stack is a layered structure of three or more layers, all oxide semiconductor layers may have different energy gaps from one another, or some of oxide semiconductor layers in the oxide semiconductor stack may have substantially the same energy gap.

For example, in an oxide semiconductor stack which is a layered structure of a first oxide semiconductor layer, a second oxide semiconductor layer, and a third oxide semiconductor layer, the energy gap of the second oxide semiconductor layer is set to be smaller than energy gaps of the first oxide semiconductor layer and the third oxide semiconductor layer. Alternatively, the electron affinity of the second oxide semiconductor layer is set to be larger than the electron affinities of the first oxide semiconductor layer and the third oxide semiconductor layer. In that case, the first oxide semiconductor layer and the third oxide semiconductor layer can have the same energy gap and the same electron affinity. The second oxide semiconductor layer with a small energy gap is provided between the first oxide semiconductor layer with a large energy gap and the third oxide semiconductor layer with a large energy gap. With such a structure of the oxide semiconductor stack, an effect of reducing the off-state current (leakage current) of a transistor can be obtained. Here, the electron affinity means an energy gap between a vacuum level and a conduction band of an oxide semiconductor.

In a transistor including an oxide semiconductor layer, the energy gap of the oxide semiconductor layer affects electric characteristics of the transistor. For example, in a transistor including an oxide semiconductor layer which has a small energy gap, on-state characteristics (e.g., on-state current or field-effect mobility) are improved. On the other hand, in a transistor including an oxide semiconductor layer which has a large energy gap, the off-state current can be decreased.

With a single oxide semiconductor layer, electric characteristics of a transistor are almost determined by the energy gap of the oxide semiconductor layer; thus, it is difficult to give desired electric characteristics to the transistor.

An oxide semiconductor stack includes a plurality of oxide semiconductor layers with energy gaps different from each other or one another, whereby electric characteristics of the transistor can be accurately controlled, and accordingly desired electric characteristics can be given to the transistor.

Therefore, a semiconductor device which meets various purposes such as high performance, high reliability, and low power consumption can be provided.

One embodiment of the invention disclosed in this specification is a semiconductor device including: an oxide semiconductor stack which includes a first oxide semiconductor layer and a second oxide semiconductor layer with energy gaps different from each other; a source electrode layer and a drain electrode layer over the oxide semiconductor stack; a gate insulating film over the source electrode layer and the drain electrode layer; and a gate electrode layer overlapping with the oxide semiconductor stack, over the gate insulating film. In the semiconductor device, a mixed region whose composition is different from a composition of the first oxide semiconductor layer and a composition of the second oxide semiconductor layer is provided between the first oxide semiconductor layer and the second oxide semiconductor layer.

Another embodiment of the invention disclosed in this specification is a semiconductor device including: an oxide semiconductor stack which includes a first oxide semiconductor layer, a second oxide semiconductor layer, and a third oxide semiconductor layer in this order; a source electrode layer and a drain electrode layer over the oxide semiconductor stack; a gate insulating film over the source electrode layer and the drain electrode layer; and a gate electrode layer overlapping with the oxide semiconductor stack, over the gate insulating film. In the semiconductor device, the second oxide semiconductor layer has a smaller energy gap than the first oxide semiconductor layer and the third oxide semiconductor layer; and a first mixed region whose composition is different from a composition of the first oxide semiconductor layer and a composition of the second oxide semiconductor layer is provided between the first oxide semiconductor layer and the second oxide semiconductor layer, and a second mixed region whose composition is different from the composition of the second oxide semiconductor layer and a composition of the third oxide semiconductor layer is provided between the second oxide semiconductor layer and the third oxide semiconductor layer.

The oxide semiconductor stack may have a structure in which a top surface and side surfaces of a lower oxide semiconductor layer are covered with an upper oxide semiconductor layer. For example, in the above embodiment, a structure in which a top surface and side surfaces of the first oxide semiconductor layer are covered with the second oxide semiconductor layer can be employed, or a structure in which a top surface of the second oxide semiconductor layer and side surfaces of the second oxide semiconductor layer (or side surfaces of the first oxide semiconductor layer and the second oxide semiconductor layer) are covered with the third oxide semiconductor layer can be employed.

In addition, a region of the oxide semiconductor stack, which does not overlap with the source electrode layer or the drain electrode layer, may have a higher oxygen concentration than a region overlapping with the source electrode layer or the drain electrode layer.

A region of the oxide semiconductor stack, which does not overlap with the gate electrode layer, may contain a dopant.

Another embodiment of the invention disclosed in this specification is a method for manufacturing a semiconductor device including the steps of: forming, over an oxide insulating film, an oxide semiconductor stack which includes a first oxide semiconductor layer and a second oxide semiconductor layer with energy gaps different from each other; forming a mixed region whose composition is different from a composition of the first oxide semiconductor layer and a composition of the second oxide semiconductor layer between the first oxide semiconductor layer and the second oxide semiconductor layer by performing heat treatment on the oxide semiconductor stack; forming a source electrode layer and a drain electrode layer over the oxide semiconductor stack; forming a gate insulating film covering the source electrode layer and the drain electrode layer; and forming a gate electrode layer over the gate insulating film.

Another embodiment of the invention disclosed in this specification is a method for manufacturing a semiconductor device including the steps of: forming a first oxide semiconductor layer over an oxide insulating film; forming an oxide semiconductor stack by forming a second oxide semiconductor layer whose energy gap is larger than an energy gap of the first oxide semiconductor layer to cover a top surface and side surfaces of the first oxide semiconductor layer; forming a mixed region whose composition is different from a composition of the first oxide semiconductor layer and a composition of the second oxide semiconductor layer between the first oxide semiconductor layer and the second oxide semiconductor layer by performing heat treatment on the oxide semiconductor stack; forming a source electrode layer and a drain electrode layer over the second oxide semiconductor layer; forming a gate insulating film covering the source electrode layer and the drain electrode layer; and forming a gate electrode layer over the gate insulating film.

Another embodiment of the invention disclosed in this specification is a method for manufacturing a semiconductor device including the steps of: forming a first oxide semiconductor layer over an oxide insulating film; forming, over the first oxide semiconductor layer, a second oxide semiconductor layer whose energy gap is smaller than an energy gap of the first oxide semiconductor layer; forming an oxide semiconductor stack by forming a third oxide semiconductor layer whose energy gap is larger than the energy gap of the second oxide semiconductor layer to cover a top surface and side surfaces of the second oxide semiconductor layer; forming a first mixed region whose composition is different from a composition of the first oxide semiconductor layer and a composition of the second oxide semiconductor layer between the first oxide semiconductor layer and the second oxide semiconductor layer and a second mixed region whose composition is different from the composition of the second oxide semiconductor layer and a composition of the third oxide semiconductor layer between the second oxide semiconductor layer and the third oxide semiconductor layer by performing heat treatment on the oxide semiconductor stack; forming a source electrode layer and a drain electrode layer over the third oxide semiconductor layer; forming a gate insulating film covering the source electrode layer and the drain electrode layer; and forming a gate electrode layer over the gate insulating film.

Furthermore, a dopant may be added to the oxide semiconductor stack with the use of the gate electrode layer as a mask so that low-resistance regions containing a dopant are formed in a self-aligned manner. The low-resistance regions have lower resistance than a channel formation region in the oxide semiconductor stack, and the channel formation region is sandwiched between the low-resistance regions. A dopant is an impurity by which the electrical conductivity of the oxide semiconductor stack is changed. As the method for adding the dopant, an ion implantation method, an ion doping method, a plasma immersion ion implantation method, or the like can be used.

With the oxide semiconductor stack including the low-resistance regions between which the channel formation region is provided in the channel length direction, on-state characteristics (e.g., on-state current and field-effect mobility) of the transistor are increased, which enables high-speed operation and high-speed response of the transistor.

In addition, heat treatment (dehydration or dehydrogenation treatment) for releasing hydrogen or moisture may be performed on the oxide semiconductor layer. The dehydration or dehydrogenation treatment can also serve as heat treatment for forming the mixed region. In addition, in the case where a crystalline oxide semiconductor layer is used as the oxide semiconductor layer, the heat treatment for forming the mixed region can also serve as heat treatment for crystallization.

The dehydration or dehydrogenation treatment may accompany elimination of oxygen which is a main constituent material for an oxide semiconductor to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy.

Thus, oxygen is preferably supplied to the oxide semiconductor layer after being subjected to the dehydration or dehydrogenation treatment. By supply of oxygen to the oxide semiconductor layer, oxygen vacancies in the film can be repaired.

For example, an oxide insulating film including much (excessive) oxygen, which serves as an oxygen supply source, can be provided so as to be in contact with the oxide semiconductor layer, whereby oxygen can be supplied to the oxide semiconductor layer from the oxide insulating film. In the above structure, heat treatment may be performed in the state where the oxide semiconductor layer after being subjected to the heat treatment as the dehydration or dehydrogenation treatment and the oxide insulating film are in contact with each other at least partly to supply oxygen to the oxide semiconductor layer.

Further or alternatively, oxygen (which includes at least one of an oxygen radical, an oxygen atom, and an oxygen ion) may be added to the oxide semiconductor layer which has been subjected to dehydration or dehydrogenation treatment to supply oxygen to the oxide semiconductor film. As a method for adding oxygen, an ion implantation method, an ion doping method, a plasma immersion ion implantation method, plasma treatment, or the like can be used.

Further, it is preferable that the oxide semiconductor layer provided in the transistor include a region where the oxygen content is higher than that in the stoichiometric composition ratio of the oxide semiconductor in a crystalline state. In that case, the oxygen content is preferably higher than that in the stoichiometric composition ratio of the oxide semiconductor. Alternatively, the oxygen content is higher than that of the oxide semiconductor in a single crystal state. In some cases, oxygen exists between lattices of the oxide semiconductor.

By removing hydrogen or moisture from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$). Accordingly, by using the oxide semiconductor layer for a transistor, fluctuation in the threshold voltage $V_{th}$ of the transistor and a shift of the threshold voltage $\Delta V_{th}$ which are due to oxygen vacancies can be reduced.

One embodiment of the present invention relates to a semiconductor device including a transistor or a semiconductor device including a circuit which is formed by using a transistor. For example, one embodiment of the present invention relates to a semiconductor device including a transistor in which a channel formation region is formed using an oxide semiconductor or a semiconductor device including a circuit which is formed by using such a transistor. For example, the present invention relates to an electronic device which includes, as a component, a semiconductor integrated circuit including an LSI, a CPU, a power device mounted in a power circuit, a memory, a thyristor, a converter, an image sensor, or the like; an electro-optical device typified by a liquid crystal display panel; or a light-emitting display device including a light-emitting element.

An oxide semiconductor stack includes a plurality of oxide semiconductor layers with energy gaps different from each other or one another, whereby electric characteristics of the transistor can be accurately controlled, and accordingly desired electric characteristics can be given to the transistor.

Therefore, a semiconductor device which meets various purposes such as high performance, high reliability, and low power consumption can be provided.

BRIEF DESCRIPTION OF THE DRAWINGS

FIGS. 13A and 13B each illustrate one embodiment of a semiconductor device.

DETAILED DESCRIPTION OF THE INVENTION

Embodiments and an example of the invention disclosed in this specification are described below with reference to the accompanying drawings. However, the invention disclosed in this specification is not limited to the following description, and it will be easily understood by those skilled in the art that modes and details thereof can be variously changed. Therefore, the invention disclosed in this specification is not construed as being limited to the description of the following embodiments and example. The ordinal numbers such as "first" and "second" are used for convenience and do not denote the order of steps and the stacking order of layers. The ordinal numbers in this specification do not denote particular names which specify the invention, either.

Embodiment 1

In this embodiment, one embodiment of a semiconductor device and a method for manufacturing the semiconductor device will be described with reference to FIGS. 1A and 1B, FIGS. 2A and 2E, and FIGS. 3A to 3D. In this embodiment, a transistor including an oxide semiconductor film will be described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and under a channel formation region with a gate insulating film provided therebetween.

Figure 1A:
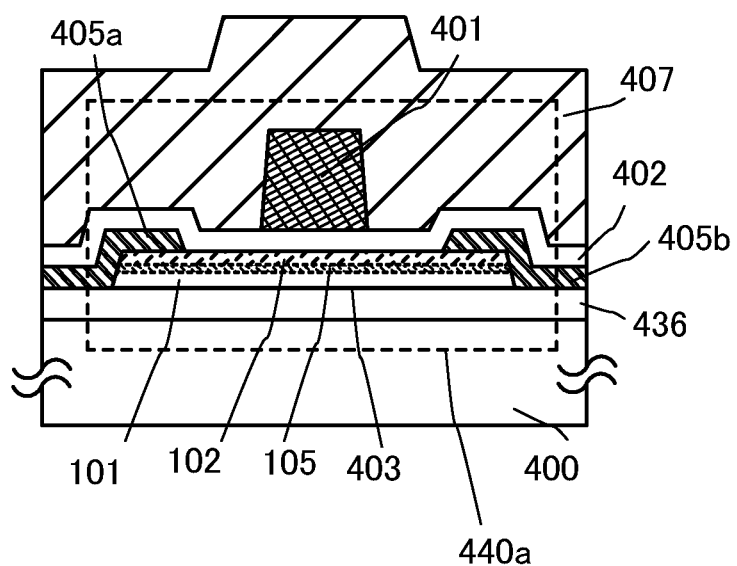
FIGS. 1A and 1B illustrate one embodiment of a semiconductor device.
Figure 1B:
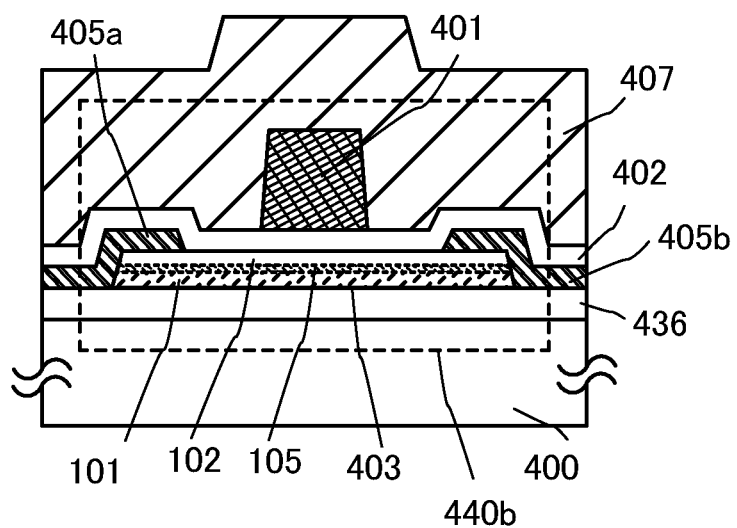

A transistor 440a in FIG. 1A and a transistor 440b in FIG. 1B are examples of planar type transistors having a top-gate structure.

As illustrated in FIGS. 1A and 1B, the transistor 440a and the transistor 440b each include, over a substrate 400 having an insulating surface, over which an oxide insulating film 436 is provided, an oxide semiconductor stack 403 including a first oxide semiconductor layer 101 and a second oxide semiconductor layer 102 with energy gaps different from each other and a mixed region 105 between the first oxide semiconductor layer 101 and the second oxide semiconductor layer 102, a source electrode layer 405a and a drain electrode layer 405b, a gate insulating film 402, and a gate electrode layer 401. An insulating film 407 is formed over the transistor 440a and the transistor 440b.

In the oxide semiconductor stack 403, the interface between the first oxide semiconductor layer 101 and the second oxide semiconductor layer 102 is unclear, and the mixed region 105 is provided between the first oxide semiconductor layer 101 and the second oxide semiconductor layer 102. Note that when the interface is unclear, for example, a continuous boundary cannot be observed between the stacked oxide semiconductor layers in a cross-sectional observation image (TEM image) of the oxide semiconductor stack 403, which is taken using a high resolution transmission electron microscope.

The mixed region 105 is a region where elements included in the first oxide semiconductor layer 101 and the second oxide semiconductor layer 102 that are stacked are mixed, and at least the composition (composition ratio) of elements included in the mixed region is different from that included in the first oxide semiconductor layer 101 and that included in the second oxide semiconductor layer 102. For example, in the case where the oxide semiconductor stack 403 has a layered structure of a first oxide semiconductor layer including indium, tin, and zinc and a second oxide semiconductor layer including indium, gallium, and zinc, the mixed region 105 including indium, tin, gallium, and zinc can be formed between the first oxide semiconductor layer and the second oxide semiconductor layer. In addition, even in the case where elements included in the first oxide semiconductor layer 101 and the second oxide semiconductor layer 102 are the same, a mixed region 105 whose composition (composition ratio) is different can be formed. Thus, the energy gap of the mixed region 105 is also different from that of the first oxide semiconductor layer 101 and that of the second oxide semiconductor layer 102, and the energy gap of the mixed region 105 is a value between the energy gap of the first oxide semiconductor layer 101 and the energy gap of the second oxide semiconductor layer 102.

Thus, when the mixed region 105 is provided, a region between the first oxide semiconductor layer 101 and the second oxide semiconductor layer 102 has a continuous energy band in the energy band diagram, and scattering in the interface between the first oxide semiconductor layer 101 and the second oxide semiconductor layer 102 that are stacked can be suppressed. Since the interface scattering can be suppressed, the transistor which includes the oxide semiconductor stack 403 provided with the mixed region 105 can have improved field-effect mobility.

By providing the mixed region 105, a gradient can be formed between the first oxide semiconductor layer 101 and the second oxide semiconductor layer 102 in the energy band diagram. The shape of the gradient may have a plurality of steps.

Note that in FIGS. 1A and 1B, an interface between the first oxide semiconductor layer 101 and the mixed region 105 and an interface between the mixed region 105 and the second oxide semiconductor layer 102 are each shown with a dotted line. This schematically shows that each interface (boundary) is unclear (indistinct) in the oxide semiconductor stack 403. The same applies to the other drawings of this specification.

In the oxide semiconductor stack 403, the first oxide semiconductor layer 101 and the second oxide semiconductor layer 102 have energy gaps different from each other and the stack order thereof is not limited.

Specifically, the energy gap of one oxide semiconductor layer in the oxide semiconductor stack 403 is greater than or equal to 3 eV, and the energy gap of the other oxide semiconductor layer is less than 3 eV.

The transistor 440a in FIG. 1A is an example of a transistor in which the second oxide semiconductor layer 102 has a larger energy gap than the first oxide semiconductor layer 101. In this embodiment, an In—Sn—Zn-based oxide film (energy gap: 2.6 eV to 2.9 eV, typically 2.8 eV) is used as the first oxide semiconductor layer 101, and an In—Ga—Zn-based oxide film (energy gap: 3.0 eV to 3.4 eV, typically 3.2 eV) is used as the second oxide semiconductor layer 102 in the transistor 440a.

In contrast, the transistor 440b in FIG. 1B is an example of a transistor in which the energy gap of the second oxide semiconductor layer 102 is smaller than the energy gap of the first oxide semiconductor layer 101. In this embodiment, an In—Ga—Zn-based oxide film (energy gap: 3.2 eV) is used as the first oxide semiconductor layer 101, and an In—Sn—Zn-based oxide film (energy gap: 2.8 eV) is used as the second oxide semiconductor layer 102 in the transistor 440b.

As described above, as for the first oxide semiconductor layer 101 and the second oxide semiconductor layer 102 in the oxide semiconductor stack 403, one of the layer which is in contact with the gate insulating film 402 may have either a larger energy gap or a smaller energy gap than the other.

Figure 4A:
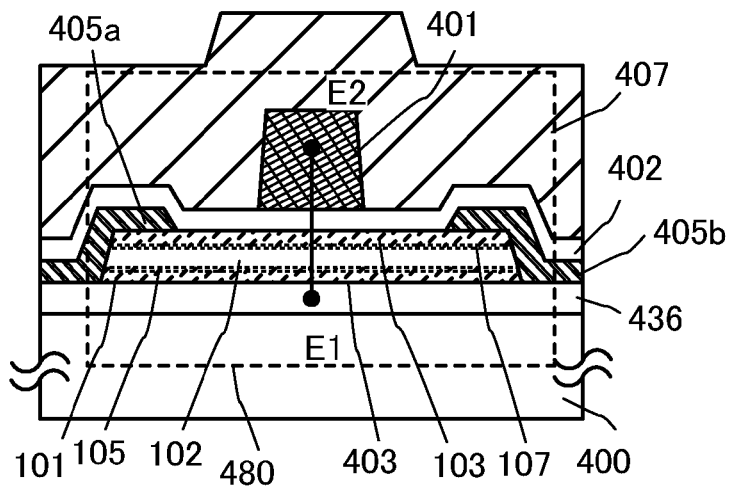
FIGS. 4A to 4C illustrate one embodiment of a semiconductor device.

FIG. 4A illustrates a transistor 480 in which the oxide semiconductor stack 403 has a three-layer structure of the first oxide semiconductor layer 101, the second oxide semiconductor layer 102, and a third oxide semiconductor layer 103.

The transistor 480 includes, over the substrate 400 having an insulating surface, over which the oxide insulating film 436 is provided, the oxide semiconductor stack 403 including the first oxide semiconductor layer 101, the second oxide semiconductor layer 102, and a third oxide semiconductor layer 103 and the mixed region 105 between the first oxide semiconductor layer 101 and the second oxide semiconductor layer 102 and a mixed region 107 between the second oxide semiconductor layer 102 and the third oxide semiconductor layer 103; the source electrode layer 405a and the drain electrode layer 405b; the gate insulating film 402; and the gate electrode layer 401. The insulating film 407 is formed over the transistor 480.

In the oxide semiconductor stack 403 in the transistor 480, not all the energy gaps of the first oxide semiconductor layer 101, the second oxide semiconductor layer 102, and the third oxide semiconductor layer 103 are the same, and the layers have at least two different energy gaps.

In the case where the oxide semiconductor stack 403 has a layered structure of three or more layers, all the oxide semiconductor layers may have different energy gaps with one another, or some of oxide semiconductor layers in the oxide semiconductor stack 403 may have substantially the same energy gap.

An oxide semiconductor used for the oxide semiconductor stack 403 (the first oxide semiconductor layer 101, the second oxide semiconductor layer 102, and the third oxide semiconductor layer 103) preferably contains at least indium (In) or zinc (Zn). In particular, In and Zn are preferably contained. In addition, as a stabilizer for reducing the variation in electric characteristics of a transistor using the oxide, it is preferable to further contain gallium (Ga). Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—

Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by a chemical formula $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions can be used.

However, the composition is not limited to those described above, and a material having an appropriate composition can be used in accordance with semiconductor characteristics which are necessary (such as mobility, threshold value, and variation). In order to obtain semiconductor characteristics which are necessary, it is preferable that the carrier density, the impurity concentration, the defect density, the atomic ratio of a metal element to oxygen, the bond distances between atoms, the density, and the like be set as appropriate.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is formed with the use of the oxide semiconductor, interface scattering can be reduced, and relatively high mobility can be obtained relatively easily.

In an oxide semiconductor having crystallinity, defects in the bulk can be further reduced and when a surface flatness is improved, a mobility higher than that of an oxide semiconductor in an amorphous state can be obtained. In order to improve the surface flatness, the oxide semiconductor is preferably formed over a flat surface. Specifically, the oxide semiconductor is preferably formed over a surface with an average surface roughness (Ra) of less than or equal to 1 nm, preferably less than or equal to 0.3 nm, more preferably less than or equal to 0.1 nm.

Note that an average surface roughness Ra is obtained by expanding arithmetic mean surface roughness, which is defined by JIS B0601: 2001 (ISO4287: 1997), into three dimensions so as to be applicable to a curved surface. Moreover, an average surface roughness Ra can be expressed as "the average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. The area of a rectangle which is obtained by projecting the specific surface on the xy plane is represented by $S_0$, and the average height of the specific surface is represented by $Z_0$. Measurement of the average surface roughness Ra can be performed using an atomic force microscope (AFM).

As the oxide semiconductor stack 403 (the first oxide semiconductor layer 101, the second oxide semiconductor layer 102, and the third oxide semiconductor layer 103), an oxide semiconductor layer which includes crystals and which has crystallinity (crystalline oxide semiconductor layer) can be used. The crystals in the crystalline oxide semiconductor layer may have crystal axes oriented in random directions or in a certain direction.

For example, as the crystalline oxide semiconductor layer, an oxide semiconductor layer including a crystal having a c-axis substantially perpendicular to a surface can be used.

The oxide semiconductor layer including a crystal having a c-axis substantially perpendicular to a surface has neither a single crystal structure nor an amorphous structure and is a c-axis aligned crystalline oxide semiconductor (also referred to as CAAC-OS) film.

The CAAC-OS film is not completely single crystal nor completely amorphous. The CAAC-OS film is an oxide semiconductor film with a crystal-amorphous mixed phase structure where a crystal portion and an amorphous portion are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal region may be different from those of another crystal region. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by deposition or by performing treatment for crystallization such as heat treatment after deposition.

With use of the CAAC-OS film in a transistor, change in electric characteristics of the transistor due to irradiation with visible light or ultraviolet light can be reduced. Thus, the transistor has high reliability.

There are three methods for obtaining a CAAC-OS film. First is a method in which an oxide semiconductor layer is deposited at a temperature higher than or equal to 200° C. and lower than or equal to 500° C. such that the c-axis is substantially perpendicular to the top surface. Second is a method in which an oxide semiconductor film is deposited thin, and is subjected to heat treatment at a temperature higher than or equal to 200° C. and lower than or equal to 700° C. such that the c-axis is substantially perpendicular to the top surface. Third is a method in which a first-layer oxide semiconductor film is deposited thin, and is subjected to heat treatment at a temperature higher than or equal to 200° C. and lower than or equal to 700° C., and a second-layer oxide semiconductor film is deposited thereover such that the c-axis is substantially perpendicular to the top surface.

Each of the first oxide semiconductor layer 101, the second oxide semiconductor layer 102, and the third oxide semiconductor layer 103 has a thickness greater than or equal to 1 nm and less than or equal to 10 nm (preferably greater than or equal to 5 nm and less than or equal to 30 nm) and can be formed by a sputtering method, a molecular beam epitaxy (MBE) method, a CVD method, a pulse laser deposition method, an atomic layer deposition (ALD) method, or the like as appropriate. Each of the first oxide semiconductor layer 101, the second oxide semiconductor layer 102, and the third oxide semiconductor layer 103 may be formed with a sputtering apparatus where deposition is performed with surfaces of a plurality of substrates set substantially perpendicular to a surface of a sputtering target.

In a transistor including an oxide semiconductor layer, the energy gap of the oxide semiconductor layer has an influence on electric characteristics of the transistor. For example, in a transistor including an oxide semiconductor layer which has a small energy gap, on-state characteristics (e.g., on-state current or field-effect mobility) are improved. On the other hand, in a transistor including an oxide semiconductor layer which has a large energy gap, the off-state current can be decreased.

The oxide semiconductor stack 403 includes a plurality of oxide semiconductor layers with energy gaps different from each other or one another, whereby electric characteristics of the transistor 440a, the transistor 440b, and the transistor 480 can be accurately controlled, and accordingly desired electric characteristics can be given to the transistor 440a, the transistor 440b, and the transistor 480.

For example, in the oxide semiconductor stack 403 in the transistor 480, the energy gap of the second oxide semiconductor layer 102 is set to be smaller than the energy gaps of the first oxide semiconductor layer 101 and the third oxide semiconductor layer 103. In that case, the first oxide semiconductor layer 101 and the third oxide semiconductor layer 103 can have substantially the same energy gap and substantially the same electron affinity.

Figure 4C:
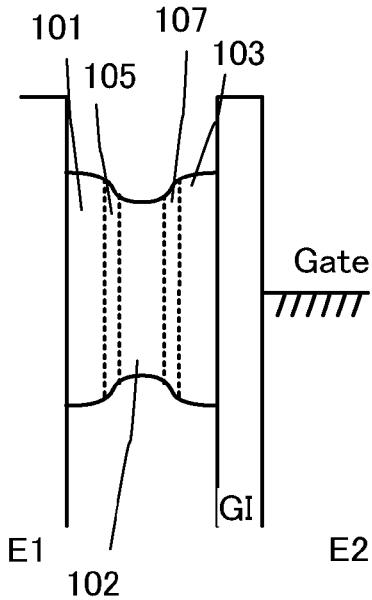

FIG. 4C is an energy band diagram in the thickness direction (E1-E2) in FIG. 4A. In the transistor 480, materials for the first oxide semiconductor layer 101, the second oxide semiconductor layer 102, and the third oxide semiconductor layer 103 are preferably selected in order to satisfy the energy band diagram of FIG. 4C. Note that when a buried channel is formed in the conduction band, sufficient effects can be obtained. Thus, an energy band diagram is not necessarily limited to a structure shown in FIG. 4C in which both conduction band and valence band have a depressed portion; for example, a structure in which only conduction band has a depressed portion may be employed. As illustrated in FIG. 4C, when the mixed region 105 and the mixed region 107 are provided, a region between the first oxide semiconductor layer 101 and the second oxide semiconductor layer 102 and a region between the second oxide semiconductor layer 102 and the third oxide semiconductor layer 103, respectively, have a continuous energy band in the energy band diagram. Thus, since the interface scattering can be suppressed in the oxide semiconductor stack 403, the transistor 480 can have improved field-effect mobility.

For example, in the transistor 480, an In—Ga—Zn-based oxide film (energy gap: 3.2 eV) is used as the first oxide semiconductor layer 101, an In—Sn—Zn-based oxide film (energy gap: 2.8 eV) is used as the second oxide semiconductor layer 102, and an In—Ga—Zn-based oxide film (energy gap: 3.2 eV) is used as the third oxide semiconductor layer 103.

Further, as the oxide semiconductor stack 403 having a three-layer structure as in the transistor 480, a stack of an In—Ga—Zn-based oxide film serving as the first oxide semiconductor layer 101, an In—Zn-based oxide film serving as the second oxide semiconductor layer 102, and an In—Ga—Zn-based oxide film serving as the third oxide semiconductor layer 103; a stack of a Ga—Zn-based oxide film serving as the first oxide semiconductor layer 101, an In—Sn—Zn-based oxide film serving as the second oxide semiconductor layer 102, and a Ga—Zn-based oxide film serving as the third oxide semiconductor layer 103; a stack of a Ga—Zn-based oxide film serving as the first oxide semiconductor layer 101, an In—Zn-based oxide film serving as the second oxide semiconductor layer 102, and a Ga—Zn-based oxide film serving as the third oxide semiconductor layer 103; a stack of an In—Ga-based oxide film serving as the first oxide semiconductor layer 101, an In—Ga—Zn-based oxide film serving as the second oxide semiconductor layer 102, and an In—Ga-based oxide film serving as the third oxide semiconductor layer 103; or a stack of an In—Ga—Zn-based oxide film serving as the first oxide semiconductor layer 101, an indium oxide (In-based oxide) film serving as the second oxide semiconductor layer 102, and an In—Ga—Zn-based oxide film serving as the third oxide semiconductor layer 103 can be used, for example.

With a structure in which the second oxide semiconductor layer 102 with small energy gap is provided between the first oxide semiconductor layer 101 with a large energy gap and the third oxide semiconductor layer 103 with a large energy gap, an effect of reducing the off-state current (leakage current) of the transistor 480 can be obtained.

FIGS. 2A to 2E illustrate an example of a method for manufacturing the transistor 440a.

First, the oxide insulating film 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 400. Still alternatively, any of these substrates further provided with a semiconductor element may be used as the substrate 400.

The semiconductor device may be manufactured using a flexible substrate as the substrate 400. In order to manufacture a flexible semiconductor device, the transistor 440a including the oxide semiconductor stack 403 may be directly formed over a flexible substrate. Alternatively, the transistor 440a including the oxide semiconductor stack 403 may be formed over a manufacturing substrate, and then, the transistor may be separated and transferred to a flexible substrate. Note that in order to separate the transistor from the manufacturing substrate and transfer it to the flexible substrate, a separation layer may be provided between the manufacturing substrate and the transistor 440a including the oxide semiconductor films.

The oxide insulating film 436 can be formed by a plasma-enhanced CVD method, a sputtering method, or the like using any of silicon oxide, silicon oxynitride, aluminum oxide, aluminum oxynitride, hafnium oxide, gallium oxide, or a mixed material thereof.

The oxide insulating film 436 may be a single layer or a stacked layer. For example, a silicon oxide film, an In—Hf—Zn-based oxide film, and the oxide semiconductor stack 403 may be stacked in this order over the substrate 400. Alternatively, a silicon oxide film, an In—Zr—Zn-based oxide film having an atomic ratio of In:Zr:Zn=1:1:1, and the oxide semiconductor stack 403 may be stacked in this order over the substrate 400. Still alternatively, a silicon oxide film, an In—Gd—Zn-based oxide film having an atomic ratio of In:Gd:Zn=1:1:1, and the oxide semiconductor stack 403 may be stacked in this order over the substrate 400.

A silicon oxide film is formed by a sputtering method as the oxide insulating film 436 in this embodiment.

Further, a nitride insulating film may be provided between the oxide insulating film 436 and the substrate 400. The nitride insulating film can be formed by a plasma-enhanced CVD method, a sputtering method, or the like with the use of silicon nitride, silicon nitride oxide, aluminum nitride, or aluminum nitride oxide, or a mixed material of any of these materials.

Figure 2A:
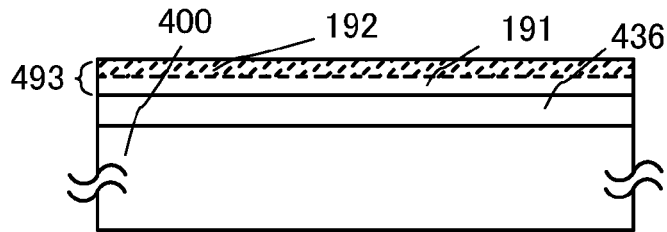
FIGS. 2A to 2E illustrate one embodiment of a semiconductor device and a method for manufacturing the semiconductor device.

Next, a stack 493 of oxide semiconductor films, which is composed of a first oxide semiconductor film 191 and a second oxide semiconductor film 192, is formed over the oxide insulating film 436 (see FIG. 2A).

The oxide insulating film 436, which is in contact with the stack 493 of the oxide semiconductor films (the oxide semiconductor stack 403), preferably contains oxygen, whose content is in excess of at least the oxygen content in the stoichiometric composition ratio, in the film (bulk). For example, in the case where a silicon oxide film is used as the oxide insulating film 436, the composition formula is $SiO_{2+\alpha}$ ($\alpha>0$). With such a film as the oxide insulating film 436, oxygen can be supplied to the stack 493 of the oxide semiconductor films (the oxide semiconductor stack 403), leading to favorable characteristics. By supply of oxygen to the stack 493 of the oxide semiconductor films (the oxide semiconductor stack 403), oxygen vacancies in the film can be filled.

For example, when the oxide insulating film 436 containing much (excessive) oxygen, which serves as an oxygen supply source, is provided in contact with the stack 493 of the oxide semiconductor films (the oxide semiconductor stack 403), oxygen can be supplied from the oxide insulating film 436 to the stack 493 of the oxide semiconductor films (the oxide semiconductor stack 403). Heat treatment may be performed in the state where the stack 493 of the oxide semiconductor films (the oxide semiconductor stack 403) and the oxide insulating film 436 are in contact with each other at least partly to supply oxygen to the stack 493 of the oxide semiconductor films (the oxide semiconductor stack 403).

In order that hydrogen or water will be not contained in the stack 493 of the oxide semiconductor films (the first oxide semiconductor film 191 and the second oxide semiconductor film 192) as much as possible in the formation step of the stack 493 of oxide semiconductor films (the first oxide semiconductor film 191 and the second oxide semiconductor film 192), it is preferable to heat the substrate provided with the oxide insulating film 436 in a preheating chamber in a sputtering apparatus as pretreatment for formation of the stack 493 of the oxide semiconductor films (the first oxide semiconductor film 191 and the second oxide semiconductor film 192) so that impurities such as hydrogen and moisture adsorbed to the substrate and/or the oxide insulating film 436 are eliminated and removed. As an evacuation unit provided in the preheating chamber, a cryopump is preferable.

Planarization treatment may be performed on the region of the oxide insulating film 436 which is in contact with the stack 493 of the oxide semiconductor films (the oxide semiconductor stack 403). As the planarization treatment, polishing treatment (e.g., chemical mechanical polishing (CMP)), dry-etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the oxide insulating film 436.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the oxide insulating film 436.

Note that it is preferable that the first oxide semiconductor film 191 and the second oxide semiconductor film 192 be formed under a condition that much oxygen is contained during film formation (e.g., deposited by a sputtering method in a 100% oxygen atmosphere), so that a film containing much oxygen (preferably including a region where the oxygen content is higher than that in the stoichiometric composition of the oxide semiconductor in a crystalline state) is formed.

Note that in this embodiment, an In—Sn—Zn—O film is formed as the first oxide semiconductor film 191 by a sputtering method with the use of, for example, an oxide target having an atomic ratio of In:Sn:Zn=1:2:2, 2:1:3, 1:1:1, or 20:45:35 as a composition ratio.

As the target for forming the second oxide semiconductor film 192 by a sputtering method in this embodiment, for example, an oxide target having a composition ratio of $In_2O_3$:$Ga_2O_3$:ZnO=1:1:2 [molar ratio] is used to form an In—Ga—Zn-based oxide film. Without limitation to the material and the composition of the above target, for example, a metal oxide target having a composition ratio of $In_2O_3$:$Ga_2O_3$:ZnO=1:1:1 [molar ratio] may be used.

The filling factor of the metal oxide target is greater than or equal to 90% and less than or equal to 100%, preferably greater than or equal to 95% and less than or equal to 99.9%. With the use of the metal oxide target with high filling factor, a dense oxide semiconductor film can be deposited.

It is preferable that a high-purity gas from which an impurity such as hydrogen, water, a hydroxyl group, or hydride is removed be used as a sputtering gas when the first oxide semiconductor film 191 and the second oxide semiconductor film 192 are deposited.

The substrate is held in a deposition chamber kept under reduced pressure. Then, a sputtering gas from which hydrogen and moisture are removed is introduced while residual moisture in the deposition chamber is removed, and the stack 493 of the oxide semiconductor films (the first oxide semiconductor film 191 and the second oxide semiconductor film 192) is deposited over the substrate 400 using the above target. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity in the stack 493 of the oxide semiconductor films (the first oxide semiconductor film 191 and the second oxide semiconductor film 192) deposited in the deposition chamber can be reduced.

The oxide insulating film 436 and the stack 493 of the oxide semiconductor films (the first oxide semiconductor film 191 and the second oxide semiconductor film 192) are preferably formed in succession without exposure to the air. When the oxide insulating film 436 and the stack 493 of the oxide semiconductor films (the first oxide semiconductor film 191 and the second oxide semiconductor film 192) are formed in succession without exposure to the air, impurities such as hydrogen or moisture can be prevented from being adsorbed onto a surface of the oxide insulating film 436.

The stack 493 of the oxide semiconductor films (the first oxide semiconductor film 191 and the second oxide semiconductor film 192) is processed into an island-shaped oxide semiconductor stack 403 (the first oxide semiconductor layer 101 and the second oxide semiconductor layer 102) by a photolithography process.

Further, a resist mask for forming the island-shaped oxide semiconductor stack 403 may be formed using an ink jet method. Formation of the resist mask by an ink jet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used.

In this embodiment, since the first oxide semiconductor film 191 and the second oxide semiconductor film 192 are etched with the same mask, the first oxide semiconductor layer 101 and the second oxide semiconductor layer 102, which have been processed, have the same shape where end portions of side surfaces thereof are aligned. The side surfaces (end portions) of the first oxide semiconductor layer 101 and the second oxide semiconductor layer 102 in the oxide semiconductor stack 403 are exposed.

Figure 2B:
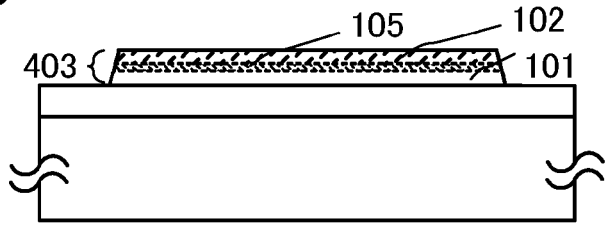

Heat treatment is performed on the oxide semiconductor stack 403, so that the mixed region 105 is formed between the first oxide semiconductor layer 101 and the second oxide semiconductor layer 102 (see FIG. 2B). The heat treatment is performed at a temperature at which the elements in the first oxide semiconductor layer 101 and the second oxide semiconductor layer 102 can be diffused by heat under such a condition that the first oxide semiconductor layer 101 and the second oxide semiconductor layer 102 do not form the mixed region whose composition is uniform in the entire region of the oxide semiconductor stack 403.

The heat treatment can be performed under reduced pressure, a nitrogen atmosphere, an oxygen atmosphere, the air (ultra-dry air), a rare gas atmosphere, or the like. The heat treatment may be performed more than once at different conditions (temperatures, atmospheres, times, or the like). In this embodiment, the heat treatment is performed at 650° C. under a nitrogen atmosphere for 1 hour and then under an oxygen atmosphere for 1 hour.

The step of performing the heat treatment for forming the mixed region 105 is not particularly limited as long as it is after the formation of the first oxide semiconductor film 191 and the second oxide semiconductor film 192, and may be performed on the first oxide semiconductor film 191 and the second oxide semiconductor film 192 in film form or on the island-shaped first oxide semiconductor layer 101 and second oxide semiconductor layer 102 as in this embodiment. In addition, the heat treatment can also serve as other heat treatment performed during the manufacturing process of the transistor, for example, heat treatment for dehydration or dehydrogenation or heat treatment for crystallization.

Further, heat treatment may be performed on the oxide semiconductor stack 403 (the stack 493 of the oxide semiconductor films) in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is introduced into an electric furnace which is one of heat treatment apparatuses, and the heat treatment is performed on the oxide semiconductor stack 403 (the stack 493 of the oxide semiconductor films) at 450° C. in a nitrogen atmosphere for 1 hour.

Note that the heat treatment apparatus is not limited to an electric furnace, and an apparatus for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in heat treatment, it is preferable that moisture, hydrogen, and the like be not contained in nitrogen or a rare gas such as helium, neon, or argon. Alternatively, it is preferable that the purity of nitrogen or the rare gas such as helium, neon, or argon which is introduced into the heat treatment apparatus be set to be higher than or equal to 6N (99.9999%), more preferably higher than or equal to 7N (99.99999%) (that is, the concentration of impurities is lower than or equal to 1 ppm, preferably lower than or equal to 0.1 ppm).

In addition, after the oxide semiconductor stack 403 (the stack 493 of the oxide semiconductor films) is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, or the like be not contained in the oxygen gas or the $N_2O$ gas. The purity of the oxygen gas or the $N_2O$ gas which is added to the heat treatment apparatus is preferably higher than or equal to 6N, more preferably higher than or equal to 7N (i.e., the impurity concentration in the oxygen gas or the $N_2O$ gas is preferably lower than or equal to 1 ppm, more preferably lower than or equal to 0.1 ppm). The oxygen gas or the $N_2O$ gas acts to supply oxygen that is a main component of the oxide semiconductor and that is reduced by the step for removing an impurity for the dehydration or dehydrogenation, so that the oxide semiconductor stack 403 (the stack 493 of the oxide semiconductor films) can be a high-purified, electrically i-type (intrinsic) oxide semiconductor stack.

Such heat treatment for dehydration or dehydrogenation may be performed at any timing in the process of manufacturing the transistor 440a as long as it is performed between the formation of the stack 493 of the oxide semiconductor films (the first oxide semiconductor film 191 and the second oxide semiconductor film 192) and the formation of the insulating film 407. For example, the heat treatment can be performed after the formation of the stack 493 of the oxide semiconductor films (the first oxide semiconductor film 191 and the second oxide semiconductor film 192), or after the formation of the island-shaped oxide semiconductor stack 403 (the first oxide semiconductor layer 101 and the second oxide semiconductor layer 102).

The heat treatment for dehydration or dehydrogenation may be performed plural times and may also serve as another heat treatment. For example, the heat treatment may be performed twice; after formation of the first oxide semiconductor film 191 and after formation of the second oxide semiconductor film 192.

It is preferable that the heat treatment for dehydration or dehydrogenation be performed in a state where the stack 493 of the oxide semiconductor films (the first oxide semiconductor film 191 and the second oxide semiconductor film 192) covers the oxide insulating film 436 before the stack 493 of the oxide semiconductor films is processed into the island-shaped oxide semiconductor stack 403 (the first oxide semiconductor layer 101 and the second oxide semiconductor layer 102). This is preferable because oxygen included in the oxide insulating film 436 can be prevented from being released by the heat treatment.

Next, a conductive film to be the source electrode layer and the drain electrode layer (including a wiring formed from the same layer as the source electrode layer and the drain electrode layer) is formed over the oxide semiconductor stack 403. The conductive film is formed using a material that can withstand heat treatment in a later step. As the conductive film used for the source electrode layer and the drain electrode layer, it is possible to use, for example, a metal film containing an element selected from Al, Cr, Cu, Ta, Ti, Mo, and W, a metal nitride film containing any of these elements as its component (a titanium nitride film, a molybdenum nitride film, or a tungsten nitride film), or the like. A metal film having a high melting point such as Ti, Mo, W, or the like or a metal nitride film of any of these elements (a titanium nitride film, a molybdenum nitride film, and a tungsten nitride film) may be stacked on one of or both of a lower side and an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

Through a photolithography process, a resist mask is formed over the conductive film, the source electrode layer 405a and the drain electrode layer 405b are formed by selective etching, and then, the resist mask is removed. In this embodiment, a tungsten film having a thickness of 10 nm is formed as the source electrode layer 405a and the drain electrode layer 405b. Owing to the small thickness of each of the source electrode layer 405a and the drain electrode layer 405b as described above, the coverage with the gate insulating film 402 formed thereover is improved. In addition, in the case where a dopant is added to the oxide semiconductor stack 403 to form a low-resistance region, a dopant can also be added to the oxide semiconductor stack 403 under the source electrode layer 405a and the drain electrode layer 405b through the source electrode layer 405a and the drain electrode layer 405b.

Since the side surfaces (end portions) of the first oxide semiconductor layer 101 and the second oxide semiconductor layer 102 in the oxide semiconductor stack 403 are exposed, each of the source electrode layer 405a and the drain electrode layer 405b is formed in contact with part of the side surfaces of the first oxide semiconductor layer 101 and the second oxide semiconductor layer 102.

Figure 2C:
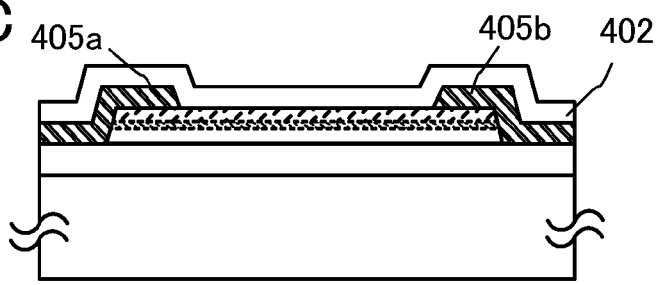

Next, the gate insulating film 402 is formed to cover the oxide semiconductor stack 403 and the source electrode layer 405a and the drain electrode layer 405b (see FIG. 2C).

To improve the coverage with the gate insulating film 402, the above-described planarizing treatment may be performed also on the surface of the oxide semiconductor stack 403 and the surfaces of the source electrode layer 405a and the drain electrode layer 405b. It is preferable that the flatness of the surface of the oxide semiconductor stack 403 and the surfaces of the source electrode layer 405a and the drain electrode layer 405b be good particularly when the thickness of the gate insulating film 402 is small.

The gate insulating film 402 can be formed to have a thickness greater than or equal to 1 nm and less than or equal to 20 nm by a sputtering method, an MBE method, a CVD method, a pulse laser deposition method, an ALD method, or the like as appropriate. Alternatively, the gate insulating film 402 may be formed with a sputtering apparatus where deposition is performed with surfaces of a plurality of substrates set substantially perpendicular to a surface of a sputtering target.

The gate insulating film 402 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating film 402 include oxygen in a portion which is in contact with the oxide semiconductor stack 403. In particular, the gate insulating film 402 preferably contains, in the film (bulk), oxygen whose content is in excess of the oxygen content in the stoichiometric composition ratio. For example, in the case where a silicon oxide film is used as the gate insulating film 402, the composition formula is $SiO_{2+\alpha}$ ($\alpha$>0). In this embodiment, a silicon oxide film of $SiO_{2+\alpha}$ ($\alpha$>0) is used as the gate insulating film 402. By using the silicon oxide film as the gate insulating film 402, oxygen can be supplied to the oxide semiconductor stack 403, leading to favorable characteristics. Further, the gate insulating film 402 is preferably formed in consideration of the size of a transistor to be formed and the step coverage with the gate insulating film 402.

The gate insulating film 402 can be formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, whereby gate leakage current can be reduced. Further, the gate insulating film 402 may have either a single-layer structure or a layered structure.

Then, the gate electrode layer 401 is formed over the gate insulating film 402 by a plasma-enhanced CVD method, a sputtering method, or the like. The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a layered structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a layered structure of the above conductive material and the above metal material.

As one layer of the gate electrode layer 401 which is in contact with the gate insulating film 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function higher than or equal to 5 eV (electron volt), preferably higher than or equal to 5.5 eV (electron volt), and the use of this film as the gate electrode layer enables the threshold voltage of electric characteristics of a transistor to be positive. Accordingly, a so-called normally-off switching element can be obtained.

Figure 2D:
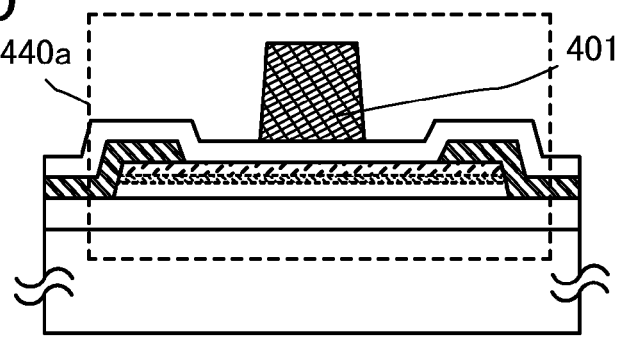

Through the above-described process, the transistor 440a of this embodiment is formed (see FIG. 2D). The oxide semiconductor stack 403 includes a plurality of oxide semiconductor layers (the first oxide semiconductor layer 101 and the second oxide semiconductor layer 102) with energy gaps different from each other, whereby electric characteristics of the transistor 440a and the transistor 440b can be accurately controlled, and accordingly desired electric characteristics can be given to the transistor 440a and the transistor 440b.

Figure 2E:
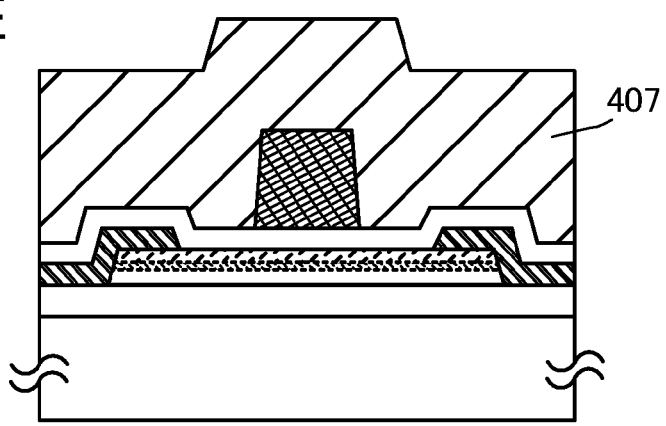

Next, the insulating film 407 is formed over the oxide semiconductor stack 403, the source electrode layer 405a and the drain electrode layer 405b, the gate insulating film 402, and the gate electrode layer 401 (see FIG. 2E).

The insulating film 407 can be formed by a plasma-enhanced CVD method, a sputtering method, an evaporation method, or the like. As the insulating film 407, an inorganic insulating film such as a silicon oxide film, a silicon oxynitride film, an aluminum oxynitride film, or a gallium oxide film, or the like can be typically used.

As the insulating film 407, an aluminum oxide film, a hafnium oxide film, a magnesium oxide film, a zirconium oxide film, a lanthanum oxide film, a barium oxide film, or a metal nitride film (e.g., an aluminum nitride film) can be used.

The insulating film 407 may be a single layer or a stack, and for example a stack of a silicon oxide film and an aluminum oxide film can be used.

The insulating film 407 is preferably formed by a method such as a sputtering method, in which an impurity such as water or hydrogen does not enter the insulating film 407. In the insulating film 407, an insulating film in contact with the oxide semiconductor stack 403 preferably contains excessive oxygen because the insulating film serves as an oxygen supply source for the oxide semiconductor stack 403.

In this embodiment, a silicon oxide film with a thickness of 100 nm is deposited as the insulating film 407 by a sputtering method. The silicon oxide film can be deposited by a sputtering method under a rare gas (typically, argon) atmosphere, an oxygen atmosphere, or a mixed atmosphere containing a rare gas and oxygen.

In order to remove residual moisture from the deposition chamber of the insulating film 407 in a manner similar to that of the formation of the oxide semiconductor film, an entrapment vacuum pump (such as a cryopump) is preferably used. When the insulating film 407 is deposited in the deposition chamber evacuated using a cryopump, the impurity concentration of the insulating film 407 can be reduced. As an evacuation unit for removing moisture remaining in the deposition chamber of the insulating film 407, a turbo molecular pump provided with a cold trap may be used.

It is preferable that a high-purity gas in which an impurity such as hydrogen, water, a hydroxyl group, or hydride is reduced be used as the sputtering gas for the deposition of the insulating film 407.

Figure 3A:
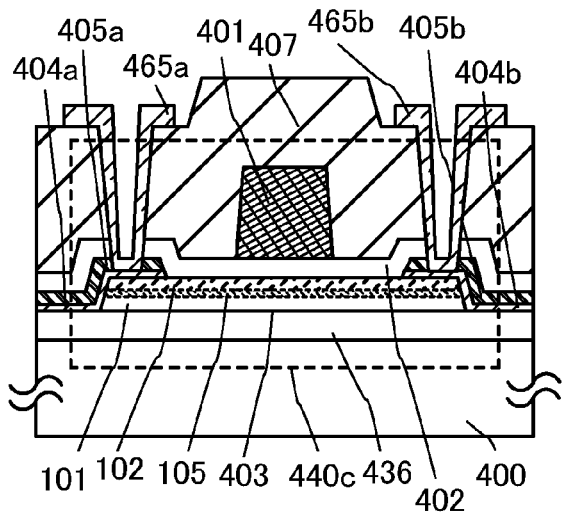
FIGS. 3A to 3D each illustrate one embodiment of a semiconductor device.
Figure 3C:
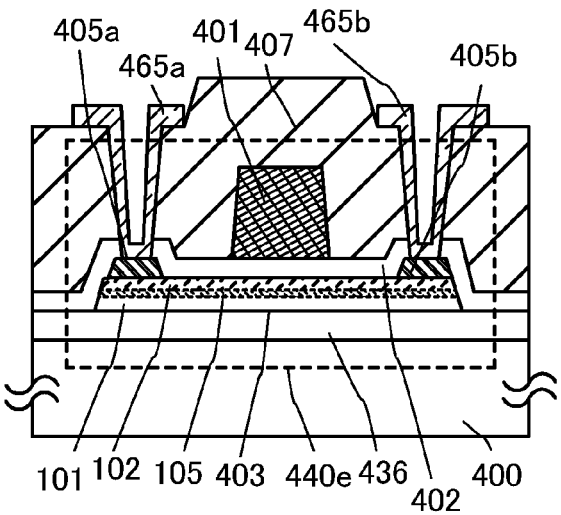
Figure 3B:
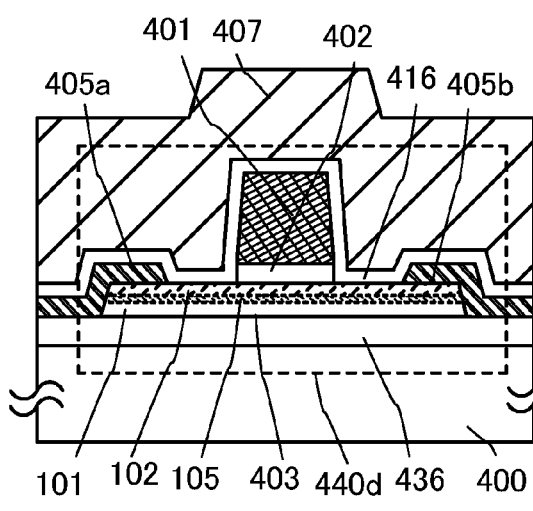

As illustrated in FIG. 3B, an insulating film 416 may be formed as an interlayer insulating film between the transistor 440d and the insulating film 407, so that an insulating film provided over the transistor 440d has a layered structure. For the formation of the insulating film 416, the material and the method for forming the insulating film 407 can be employed. For example, an aluminum oxide film is used as the insulating film 416 and a silicon oxide film is used as insulating film 407, whereby a stack of the aluminum oxide film and the silicon oxide film can be used as the insulating film provided over the transistor 440d. Note that the transistor 440d is an example of a transistor in which the gate insulating film 402 is etched using the gate electrode layer 401 as a mask to expose part of the oxide semiconductor stack 403, and the insulating film 416 is formed to be in contact with part of the oxide semiconductor stack 403.

The insulating film 407 formed over the oxide semiconductor stack 403 and the aluminum oxide film which can be used as the insulating film 416 have a high shielding effect (blocking effect) of preventing penetration of both oxygen and an impurity such as hydrogen or moisture.

Therefore, during the manufacturing process and after the manufacture, the aluminum oxide film functions as a protective film for preventing entry of an impurity such as hydrogen or moisture, which might cause variation in characteristics, into the oxide semiconductor stack 403, and release of oxygen, which is a main component material of the oxide semiconductor, from the oxide semiconductor stack 403.

Further, a planarization insulating film can be formed thereover in order to reduce surface roughness due to the transistor. As the planarization insulating film, an organic material such as a polyimide, an acrylic resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

In addition, openings reaching the source electrode layer 405a and the drain electrode layer 405b may be formed in the gate insulating film 402 and the insulating film 407, and a wiring layer electrically connected to the source electrode layer 405a or the drain electrode layer 405b may be formed in the opening. Various structures of circuits can be configured by connecting the transistor 440d to another transistor through the wiring layer.

The source electrode layer 405a and the drain electrode layer 405b are in some cases partly removed due to overetching in the etching process for forming the openings reaching the source electrode layer 405a or the drain electrode layer 405b. The source electrode layer and the drain electrode layer can have a layered structure and be formed of a conductive film, which serves as an etching stopper in the formation of the openings.

As illustrated in FIG. 3A, the transistor 440c is an example of a transistor in which the source electrode layer and the drain electrode layer have a layered structure. A source electrode layer 404a and a source electrode layer 405a are stacked to form the source electrode layer, and a drain electrode layer 404b and a drain electrode layer 405b are stacked to form the drain electrode layer. As in the transistor 440c, openings reaching the source electrode layer 404a or the drain electrode layer 404b may be formed in the gate insulating film 402, the insulating film 407, and the source electrode layer 405a and the drain electrode layer 405b, and a wiring layer 465a and a wiring layer 465b electrically connected to the source electrode layer 404a and the drain electrode layer 404b may be formed in the openings.

In the transistor 440c, the source electrode layer 404a and the drain electrode layer 404b also serves as an etching stopper in the formation of the openings. For the source electrode layer 404a and the drain electrode layer 404b, a tungsten film, a tantalum nitride film, or the like can be used. For the source electrode layer 405a and the drain electrode layer 405b, a copper film, an aluminum film, or the like can be used. When the thickness of the stack of the source electrode layer 404a and the source electrode layer 405a and the thickness of the stack of the drain electrode layer 404b and the drain electrode layer 405b are each greater than or equal to 5 nm and less than or equal to 15 nm, the coverage with the gate insulating film 402 can be high.

As employed for a transistor 440e in FIG. 3C, a structure in which the source electrode layer 405a and the drain electrode layer 405b are provided only over the oxide semiconductor stack 403 so that the source electrode layer 405a and the drain electrode layer 405b are not in contact with the side surfaces of the oxide semiconductor stack 403 may be employed. With such a structure, generation of the leakage current between the source electrode layer 405a and the drain electrode layer 405b of the transistor 440e (parasitic channel) can be further reduced.

The wiring layer 465a and the wiring layer 465b can be formed using a material and a method similar to those of the gate electrode layer 401 and the source electrode layer 405a and the drain electrode layer 405b. For example, it is possible to use a layered structure of a tantalum nitride film and a copper film or a layered structure of a tantalum nitride film and a tungsten film for each of the wiring layer 465a and the wiring layer 465b.

Alternatively, a sidewall insulating layer may be provided on the side surface of the gate electrode layer 401. The sidewall insulating layer may be formed on the side surface of the gate electrode layer 401 in a self-aligned manner by forming an insulating film covering the gate electrode layer 401 and then processing the insulating film by anisotropic etching by a reactive ion etching (RIE) method. There is no particular limitation on the insulating film; for example, the insulating film can be formed using silicon oxide with favorable step coverage, which is formed by reaction of tetraethyl orthosilicate (TEOS), silane, or the like with oxygen, nitrous oxide, or the like. The insulating film can be formed by a thermal CVD method, a plasma-enhanced CVD method, an atmospheric pressure CVD method, a bias ECRCVD method, a sputtering method, or the like. A silicon oxide film formed by a low temperature oxidation (LTO) method may also be used.

The oxide semiconductor stack 403 is highly purified, and oxygen vacancies therein are filled; impurities such as hydrogen or water therein are sufficiently removed. The hydrogen concentration in the oxide semiconductor stack 403 is lower than or equal to $5 \times 10^{19}/cm^3$, preferably lower than or equal to $5 \times 10^{18}/cm^3$. Note that the concentration of hydrogen in the oxide semiconductor stack 403 is measured by secondary ion mass spectrometry (SIMS).

In the case of the transistor 440a using the highly purified oxide semiconductor stack 403 containing an excess of oxygen that fills oxygen vacancies according to this embodiment, the current value in the off state (off-state current value) can be reduced to a value less than or equal to 100 zA per micrometer of channel width at room temperature (1 zA (zeptoampere)=$1 \times 10^{-21}$ A), preferably less than or equal to 10 zA/μm, further preferably less than or equal to 1 zA/μm, still further preferably less than or equal to 100 yA/μm.

As described above, a semiconductor device which meets various purposes such as high performance, high reliability, and low power consumption can be provided.

Embodiment 2

In this embodiment, another embodiment of a semiconductor device and a method for manufacturing the semiconductor device will be described with reference to FIGS. 7A to 7C, FIGS. 8A to 8C, and FIGS. 11A and 11B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

In this embodiment, an example of a structure in which an upper oxide semiconductor layer covers side surfaces of a lower oxide semiconductor layer in an oxide semiconductor stack is shown. Since the side surfaces of the lower oxide semiconductor layer are covered with the upper oxide semiconductor layer, the lower oxide semiconductor layer is in contact with neither a source electrode layer nor a drain electrode layer.

Figure 7A:
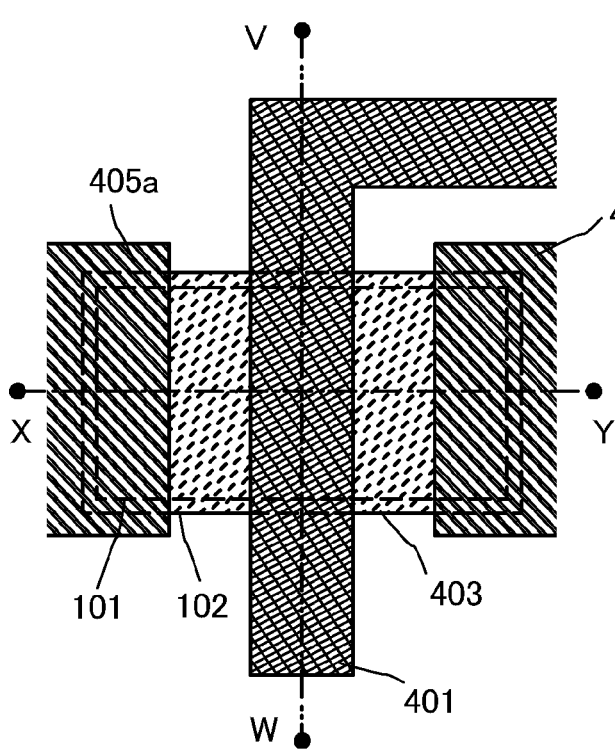
FIGS. 7A to 7C illustrate one embodiment of a semiconductor device.
Figure 7C:
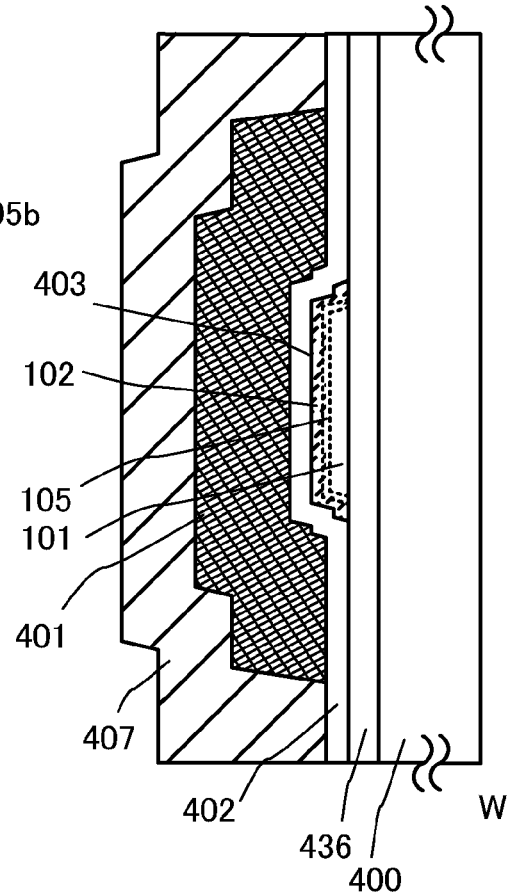
Figure 7B:
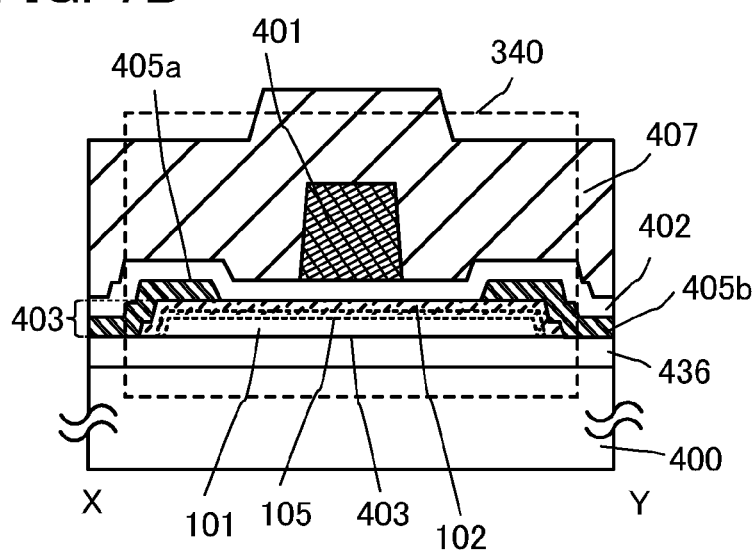

A transistor 340 illustrated in FIG. 7A to 7C is an example of a top-gate transistor. FIG. 7A is a plan view, FIG. 7B is a cross-sectional view taken along the chain line X-Y in FIG. 7A, and FIG. 7C is a cross-sectional view taken along the chain line V-W in FIG. 7A.

As illustrated in a cross-sectional view in the channel length direction in FIG. 7B, the transistor 340 includes, over the substrate 400 having an insulating surface, over which the oxide insulating film 436 is provided, the oxide semiconductor stack 403 including the first oxide semiconductor layer 101, the mixed region 105, and the second oxide semiconductor layer 102; the source electrode layer 405a and the drain electrode layer 405b; the gate insulating film 402; and the gate electrode layer 401. The first oxide semiconductor layer 101 is formed over and in contact with the oxide insulating film 436, and the second oxide semiconductor layer 102 is formed to cover the top surface and side surfaces of the first oxide semiconductor layer 101. The mixed region 105 is provided between the first oxide semiconductor layer 101 and the second oxide semiconductor layer 102. The periphery of the second oxide semiconductor layer 102 is in contact with the oxide insulating film 436.

The energy gaps and compositions of the first oxide semiconductor layer 101, the mixed region 105, and the second oxide semiconductor layer 102 are different from one another. In the example of this embodiment, in which the energy gap of the second oxide semiconductor layer 102 is larger than the energy gap of the first oxide semiconductor layer 101, the energy gap of the mixed region 105 provided therebetween is larger than the energy gap of the first oxide semiconductor layer 101 and smaller than the energy gap of the second oxide semiconductor layer 102.

FIG. 7C is a cross-sectional view in the channel width direction, and as in FIG. 7B, the end portions (side surfaces) of the first oxide semiconductor layer 101 are covered with the end portions of the second oxide semiconductor layer 102. In this structure, the first oxide semiconductor layer 101 is in contact with neither the source electrode layer 405a nor the drain electrode layer 405b. With such a structure, generation of the leakage current between the source electrode layer 405a and the drain electrode layer 405b of the transistor 340 (parasitic channel) is reduced.

Figure 8A:
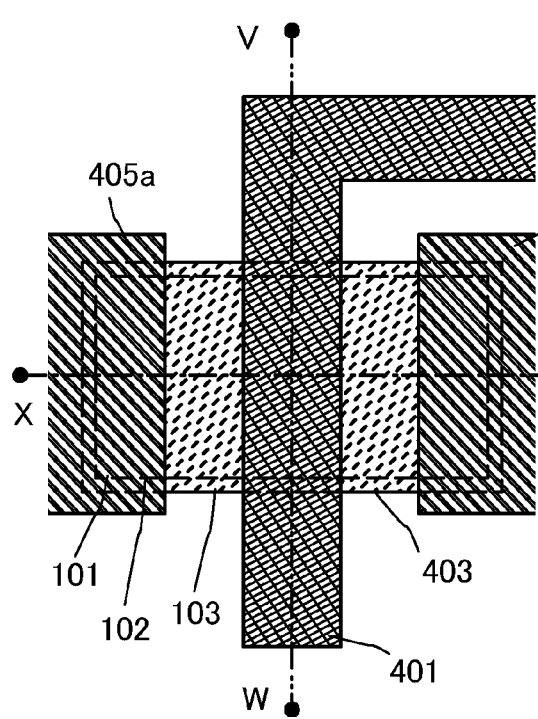
FIGS. 8A to 8C illustrate one embodiment of a semiconductor device.
Figure 8C:
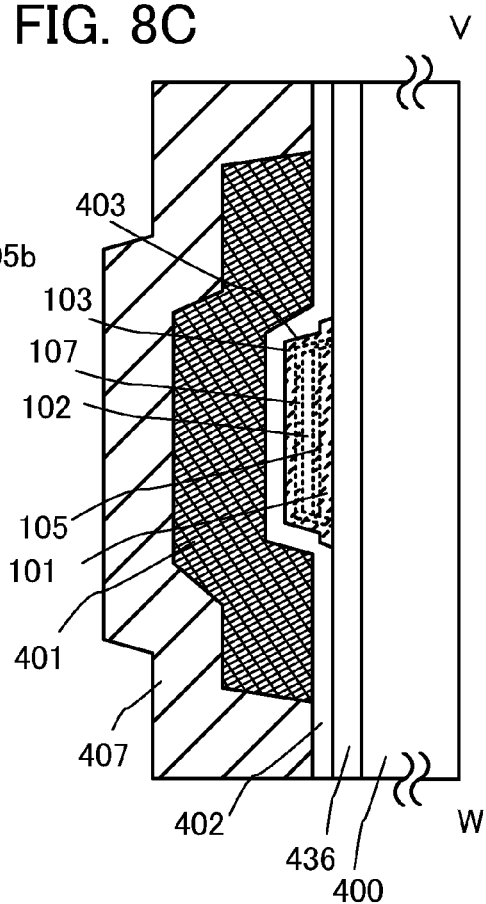
Figure 8B:
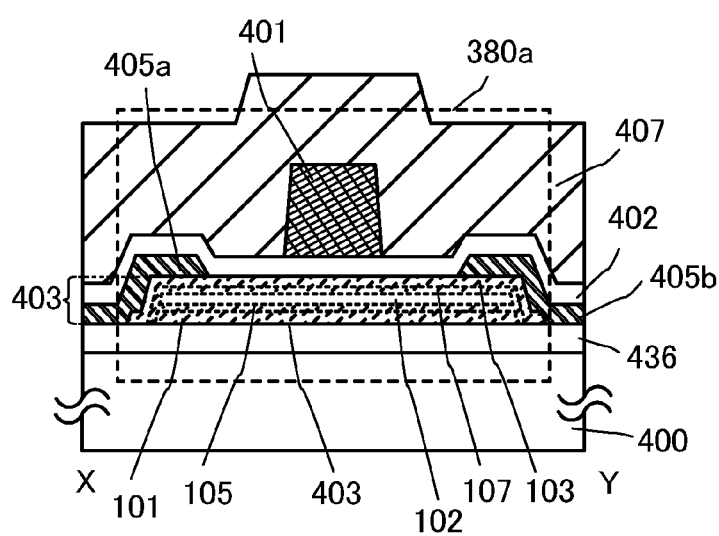

FIGS. 8A to 8C illustrate a transistor 380a in which the oxide semiconductor stack 403 has a three-layer structure of the first oxide semiconductor layer 101, the second oxide semiconductor layer 102, and the third oxide semiconductor layer 103.

The transistor 380a illustrated in FIG. 8A to 8C is an example of a top-gate transistor. FIG. 8A is a plan view, FIG. 8B is a cross-sectional view taken along the chain line X-Y in FIG. 8A, and FIG. 8C is a cross-sectional view taken along the chain line V-W in FIG. 8A.

As illustrated in a cross-sectional view in the channel length direction in FIG. 8B, the transistor 380a includes, over the substrate 400 having an insulating surface, over which the oxide insulating film 436 is provided, the oxide semiconductor stack 403 including the first oxide semiconductor layer 101, the mixed region 105, the second oxide semiconductor layer 102, the mixed region 107, and the third oxide semiconductor layer 103; the source electrode layer 405a and the drain electrode layer 405b; the gate insulating film 402; and the gate electrode layer 401. The first oxide semiconductor layer 101 is formed over and in contact with the oxide insulating film 436, and the second oxide semiconductor layer 102 is stacked over the first oxide semiconductor layer 101. The third oxide semiconductor layer 103 is formed to cover the side surfaces of the first oxide semiconductor layer 101 and the top surface and side surfaces of the second oxide semiconductor layer 102. The mixed region 105 is provided between the first oxide semiconductor layer 101 and the second oxide semiconductor layer 102, and the mixed region 107 is provided between the second oxide semiconductor layer 102 and the third oxide semiconductor layer 103. The periphery of the third oxide semiconductor layer 103 is in contact with the oxide insulating film 436.

The energy gaps and compositions of the first oxide semiconductor layer 101, the mixed region 105, and the second oxide semiconductor layer 102 are different from one another. In the example of this embodiment, in which the energy gap of the second oxide semiconductor layer 102 is larger than the energy gap of the first oxide semiconductor layer 101, the energy gap of the mixed region 105 provided therebetween is larger than the energy gap of the first oxide semiconductor layer 101 and smaller than the energy gap of the second oxide semiconductor layer 102.

The energy gaps and compositions of the second oxide semiconductor layer 102, the mixed region 107, and the third oxide semiconductor layer 103 are different from one another. In the example of this embodiment, in which the energy gap of the third oxide semiconductor layer 103 is larger than the energy gap of the second oxide semiconductor layer 102, the energy gap of the mixed region 107 provided therebetween is larger than the energy gap of the second oxide semiconductor layer 102 and smaller than the energy gap of the third oxide semiconductor layer 103.

Note that in this embodiment, the energy gap of the third oxide semiconductor layer 103 is almost the same as the energy gap of the first oxide semiconductor layer 101.

For example, in the transistor 380a, an In—Ga—Zn-based oxide film (energy gap: 3.2 eV) is used as the first oxide semiconductor layer 101, an In—Sn—Zn-based oxide film (energy gap: 2.8 eV) is used as the second oxide semiconductor layer 102, and an In—Ga—Zn-based oxide film (energy gap: 3.2 eV) is used as the third oxide semiconductor layer 103.

Further, as the oxide semiconductor stack 403 having a three-layer structure as in the transistor 380a, a stack of an In—Ga—Zn-based oxide film serving as the first oxide semiconductor layer 101, an In—Zn-based oxide film serving as the second oxide semiconductor layer 102, and an In—Ga—Zn-based oxide film serving as the third oxide semiconductor layer 103; a stack of a Ga—Zn-based oxide film serving as the first oxide semiconductor layer 101, an In—Sn—Zn-based oxide film serving as the second oxide semiconductor layer 102, and a Ga—Zn-based oxide film serving as the third oxide semiconductor layer 103; a stack of a Ga—Zn-based oxide film serving as the first oxide semiconductor layer 101, an In—Zn-based oxide film serving as the second oxide semiconductor layer 102, and a Ga—Zn-based oxide film serving as the third oxide semiconductor layer 103; a stack of an In—Ga-based oxide film serving as the first oxide semiconductor layer 101, an In—Ga—Zn-based oxide film serving as the second oxide semiconductor layer 102, and an In—Ga-based oxide film serving as the third oxide semiconductor layer 103; or a stack of an In—Ga—Zn-based oxide film serving as the first oxide semiconductor layer 101, an indium oxide (In-based oxide) film serving as the second oxide semiconductor layer 102, and an In—Ga—Zn-based oxide film serving as the third oxide semiconductor layer 103 can be used, for example.

FIG. 8C is a cross-sectional view in the channel width direction, and as in FIG. 8B, the end portions (side surfaces) of the first oxide semiconductor layer 101 and the second oxide semiconductor layer 102 are covered with the end portions of the third oxide semiconductor layer 103. In this structure, the first oxide semiconductor layer 101 and the second oxide semiconductor layer 102 are in contact with neither the source electrode layer 405a nor the drain electrode layer 405b. With such a structure, generation of the leakage current between the source electrode layer 405a and the drain electrode layer 405b of the transistor 380a (parasitic channel) is reduced.

The periphery of the second oxide semiconductor layer 102 is surrounded with the first oxide semiconductor layer 101 and the third oxide semiconductor layer 103, so that an increase in oxygen vacancy of the second oxide semiconductor layer 102 is suppressed and the threshold voltage of the transistor 380a can be made to be close to zero. Further, the second oxide semiconductor layer 102 functions as a buried channel, so that a channel formation region can be kept away from the interface between the oxide insulating film 436 and the first oxide semiconductor layer 101 and the interface between the gate insulating film 402 and the third oxide semiconductor layer 103. Accordingly, interface scattering of carriers can be reduced, so that a transistor can have high field effect mobility.

Figure 11A:
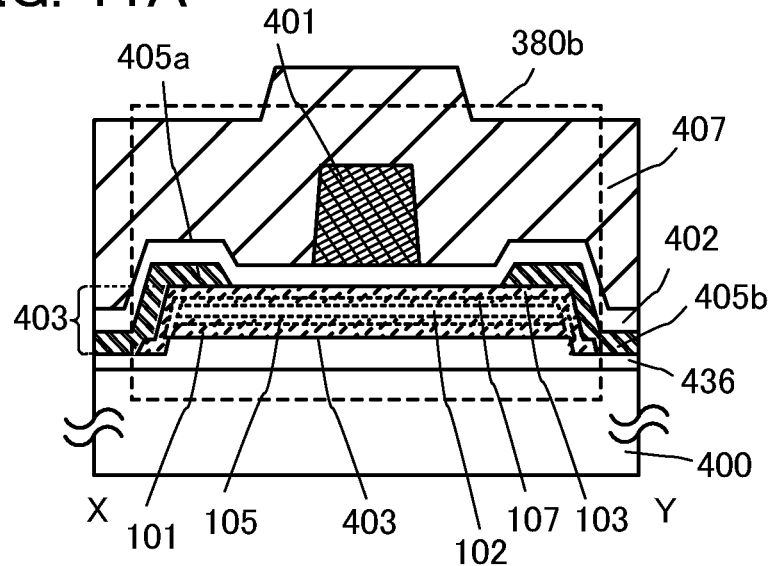
FIGS. 11A and 11B each illustrate one embodiment of a semiconductor device.

A transistor 380b illustrated in FIG. 11A has a structure in which part of the oxide insulating film 436 is etched to be thin with the use of a mask which is used for processing the first oxide semiconductor layer 101 and the second oxide semiconductor layer 102 to have an island shape (or with the use of the first island-shaped oxide semiconductor layer 101 and the second island-shaped oxide semiconductor layer 102 which are formed by the processing, as a mask). In the transistor 380b, a region of the oxide insulating film 436, which overlaps with the first island-shaped oxide semiconductor layer 101 and the second island-shaped oxide semiconductor layer 102, has a larger thickness than the other region of the oxide insulating film 436, which does not overlap with the first island-shaped oxide semiconductor layer 101 and the second island-shaped oxide semiconductor layer 102. When part of the oxide insulating film 436 is etched at the time of processing the first oxide semiconductor layer 101 and the second oxide semiconductor layer 102 to have an island shape, an etching residue such as residue of the first oxide semiconductor layer 101 is removed, so that generation of leakage current can be reduced.

Figure 11B:
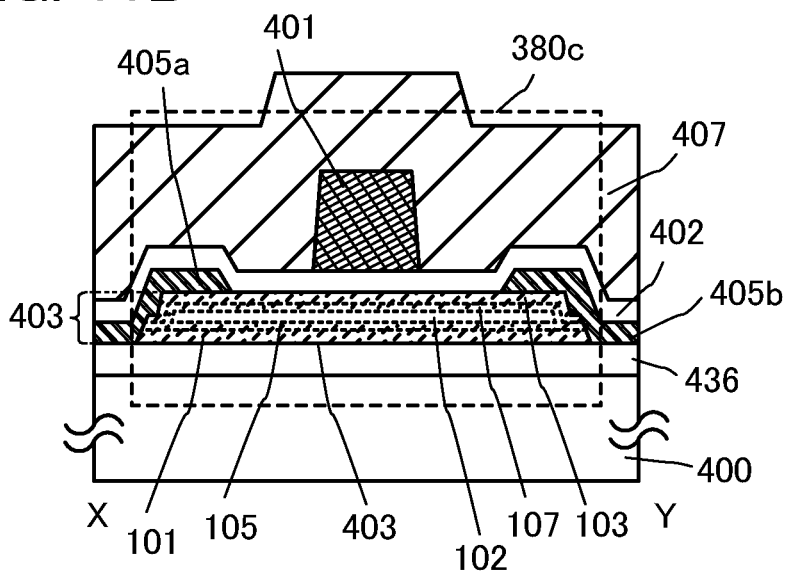

A transistor 380c illustrated in FIG. 11B has a structure in which the oxide semiconductor stack 403 is formed by performing photolithography processes three times. The oxide semiconductor stack 403 included in the transistor 380c is formed as follows: a first oxide semiconductor film is formed; the first oxide semiconductor film is processed into the first island-shaped oxide semiconductor layer 101 with the use of a first mask; a second oxide semiconductor film is formed over the first island-shaped oxide semiconductor layer 101; the second oxide semiconductor film is processed into the second island-shaped oxide semiconductor layer 102 with the use of a second mask; a third oxide semiconductor film is formed over the first island-shaped oxide semiconductor layer 101 and the second island-shaped oxide semiconductor layer 102; and the third oxide semiconductor film is processed into the third island-shaped oxide semiconductor layer 103 with the use of a third mask.

Note that the transistor 380c has a structure in which a side surface of the first oxide semiconductor layer 101 extends beyond a side surface of the second oxide semiconductor layer 102, and the third oxide semiconductor layer 103 is in contact with part of a top surface of the first oxide semiconductor layer 101.

As described above, a semiconductor device which meets various purposes such as high performance, high reliability, and low power consumption can be provided.

This embodiment can be implemented in appropriate combination with the other embodiments.

Embodiment 3

In this embodiment, another embodiment of a semiconductor device and a method for manufacturing the semiconductor device will be described with reference to FIGS. 5A to 5C. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

This embodiment shows, in a method for manufacturing a semiconductor device according to one embodiment of the disclosed invention, oxygen (which includes at least one of an oxygen radical, an oxygen atom, and an oxygen ion) is added to an oxide semiconductor stack which has been subjected to dehydration or dehydrogenation treatment to supply oxygen to the oxide semiconductor film.

The dehydration or dehydrogenation treatment may accompany elimination of oxygen which is a main constituent material for an oxide semiconductor to lead to a reduction in oxygen. An oxygen vacancy exists in a portion where oxygen is eliminated in an oxide semiconductor stack, and a donor level which leads to a change in the electric characteristics of a transistor is formed owing to the oxygen vacancy.

Thus, oxygen is preferably supplied to the oxide semiconductor stack after being subjected to the dehydration or dehydrogenation treatment. By supply of oxygen to the oxide semiconductor stack, oxygen vacancies in the film can be filled. Accordingly, by using the oxide semiconductor stack for a transistor, fluctuation in the threshold voltage $V_{th}$ of the transistor and a shift of the threshold voltage $\Delta V_{th}$ which are due to oxygen vacancies can be reduced. In addition, the threshold voltage can be positively shifted to make a normally-off transistor.

Figure 5A:
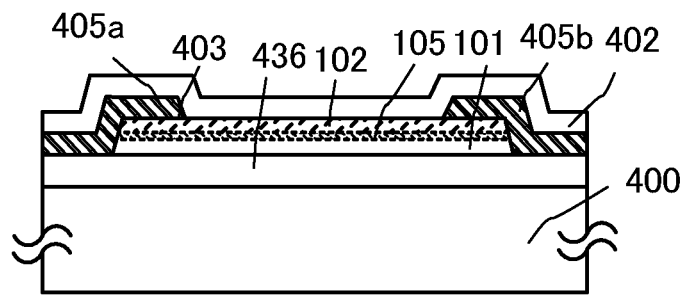
FIGS. 5A to 5C illustrate one embodiment of a semiconductor device and a method for manufacturing the semiconductor device.

FIG. 5A corresponds to FIG. 2C, in which, over the substrate 400 having an insulating surface, over which the oxide insulating film 436 is provided, the oxide semiconductor stack 403 including the first oxide semiconductor layer 101 and the second oxide semiconductor layer 102 with energy gaps different from each other and the mixed region 105 between the first oxide semiconductor layer 101 and the second oxide semiconductor layer 102, the source electrode layer 405a and the drain electrode layer 405b, and the gate insulating film 402 are formed.

Figure 5B:
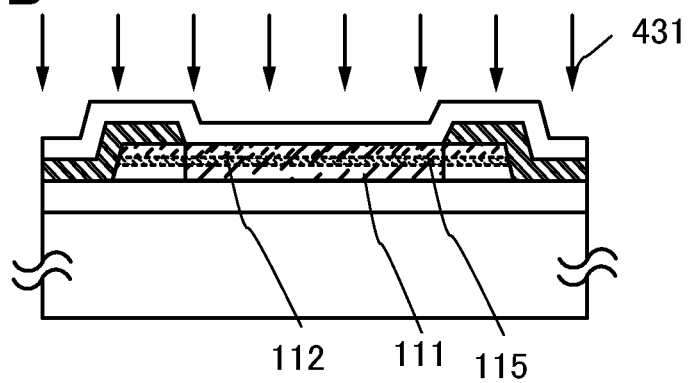

Next, oxygen 431 (which contains at least any of an oxygen radical, an oxygen atom, and an oxygen ion) is added to the oxide semiconductor stack 403 to supply oxygen, whereby oxygen-excess regions 111, 112, and 115 are formed in the oxide semiconductor stack 403 including the first oxide semiconductor layer 101, the second oxide semiconductor layer 102, and the mixed region 105 (see FIG. 5B).

Note that each of the oxygen-excess regions 111, 112, and 115 at least partly includes a region containing oxygen whose content is in excess of the oxygen content in the stoichiometric ratio in the oxide semiconductor in a crystalline state. The oxygen 431 supplied to the oxygen-excess regions 111, 112, and 115 can fill oxygen vacancies in the oxide semiconductor stack 403 including the first oxide semiconductor layer 101, the second oxide semiconductor layer 102, and the mixed region 105.

Figure 5C:
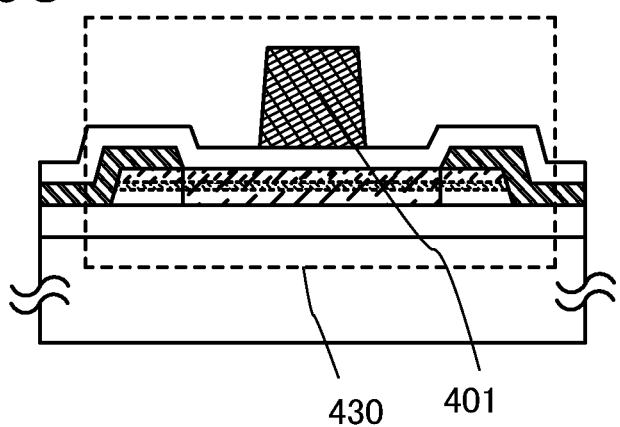

The gate electrode layer 401 is formed over the gate insulating film 402 and the oxide semiconductor stack 403 including the oxygen-excess regions 111, 112, and 115, whereby a transistor 430 is formed (see FIG. 5C).

Figure 9A:
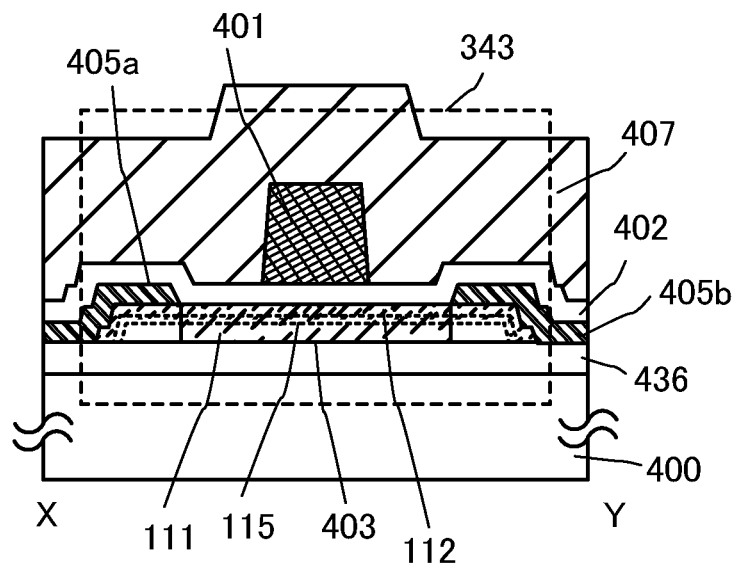
FIGS. 9A and 9B each illustrate one embodiment of a semiconductor device.
Figure 9B:
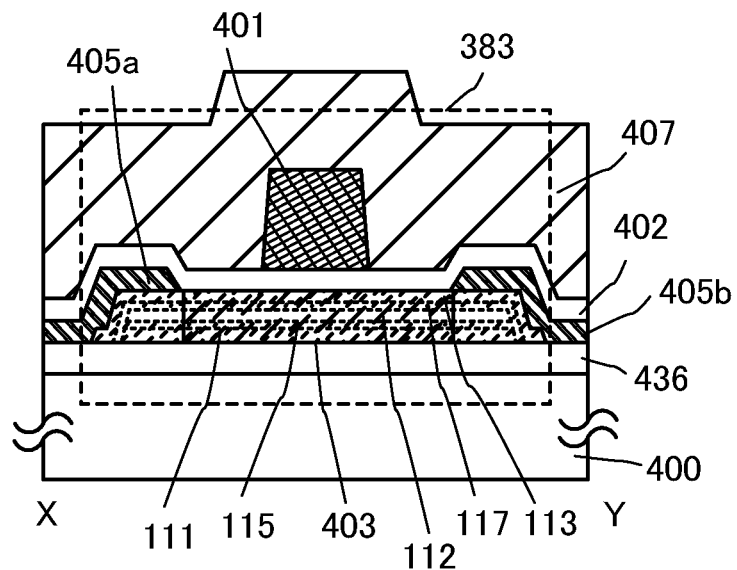

Note that the transistor 340 and the transistor 380a described in Embodiment 2, in each of which the upper oxide semiconductor layer covers the side surfaces of the lower oxide semiconductor layer, can be provided with an oxygen-excess region by adding oxygen to the oxide semiconductor stack 403, and such examples are illustrated in FIGS. 9A and 9B.

A transistor 343 in FIG. 9A includes, over the substrate 400 having an insulating surface, over which the oxide insulating film 436 is provided, the oxide semiconductor stack 403 including the first oxide semiconductor layer 101 and the second oxide semiconductor layer 102 with energy gaps different from each other and the mixed region 105 between the first oxide semiconductor layer 101 and the second oxide semiconductor layer 102, the source electrode layer 405a and the drain electrode layer 405b, the gate insulating film 402, and the gate electrode layer 401. The insulating film 407 is formed over the transistor 343. In the transistor 343, the oxide semiconductor stack 403 includes the first oxide semiconductor layer 101 including the oxygen-excess region 111, the second oxide semiconductor layer 102 including the oxygen-excess region 112, and the mixed region 105 including the oxygen-excess region 115.

A transistor 383 in FIG. 9B includes, over the substrate 400 having an insulating surface, over which the oxide insulating film 436 is provided, the oxide semiconductor stack 403 including the first oxide semiconductor layer 101, the second oxide semiconductor layer 102, and the third oxide semiconductor layer 103 with energy gaps different from one another and the mixed region 105 between the first oxide semiconductor layer 101 and the second oxide semiconductor layer 102 and the mixed region 107 between the second oxide semiconductor layer 102 and the third oxide semiconductor layer 103; the source electrode layer 405a and the drain electrode layer 405b; the gate insulating film 402; and the gate electrode layer 401. The insulating film 407 is formed over the transistor 383. In the transistor 383, the oxide semiconductor stack 403 includes the first oxide semiconductor layer 101 including the oxygen-excess region 111, the second oxide semiconductor layer 102 including the oxygen-excess region 112, the third oxide semiconductor layer 103 including an oxygen-excess region 113, the mixed region 105 including the oxygen-excess region 115, and the mixed region 107 including an oxygen-excess region 117.

Note that in the oxide semiconductor stack in which the oxide semiconductor layer whose energy gap is larger than the energy gap of the lower oxide semiconductor layer is stacked as an upper layer, the upper oxide semiconductor layer covers the side surfaces of the lower oxide semiconductor layer, whereby generation of the leakage current between the source electrode layer and the drain electrode layer of the transistor (parasitic channel) can be reduced.

Oxygen which is added to the oxide semiconductor stack 403 which has been subjected to dehydration or dehydrogenation treatment to supply oxygen to the film can highly purify the oxide semiconductor stack 403 and make the film an electrically i-type (intrinsic). Variation in the electric characteristics of the transistor 430, the transistor 343, and the transistor 383 each including the highly purified and i-type (intrinsic) oxide semiconductor stack 403 is suppressed and the transistors are electrically stable.

As a method for adding oxygen, an ion implantation method, an ion doping method, a plasma immersion ion implantation method, plasma treatment, or the like can be used.

In the step of addition of oxygen to the oxide semiconductor stack 403, oxygen may be directly added to the oxide semiconductor stack 403 or to the oxide semiconductor stack 403 through another film such as the gate insulating film 402 or the insulating film 407. An ion implantation method, an ion doping method, a plasma immersion ion implantation method, or the like can be employed for the addition of oxygen through another film, whereas plasma treatment or the like can also be employed for the direct addition of oxygen to an exposed oxide semiconductor stack 403.

As described above, the addition of oxygen to the oxide semiconductor stack 403 can be performed anytime after dehydration or dehydrogenation treatment is performed thereon, and the timing is not particularly limited. Further, oxygen may be added plural times to the oxide semiconductor stack 403 subjected to the dehydration or dehydrogenation treatment.

For example, in Embodiment 1, the addition of oxygen to the oxide semiconductor stack 403 can be performed on the exposed stack 493 of the oxide semiconductor films or the oxide semiconductor stack 403 after the formation of the source electrode layer 405a and the drain electrode layer 405b, after the formation of the gate insulating film 402, after the formation of the gate electrode layer 401, (after the formation of the insulating film 416), and/or after the formation of the insulating film 407.

In the oxygen-excess regions 111 and 112 in the oxide semiconductor stack 403, the concentration of oxygen added by the oxygen addition step is preferably greater than or equal to $1\times10^{18}$ atoms/cm$^3$ and less than or equal to $5\times10^{21}$ atoms/cm$^3$.

In the oxide semiconductor, oxygen is one of main component materials. Thus, it is difficult to estimate accurately the oxygen concentration in the oxide semiconductor stack 403 by a method such as SIMS. In other words, it can be said that it is hard to determine whether oxygen is intentionally added to the oxide semiconductor stack 403 or not.

It is known that isotopes such as $^{17}O$ and $^{18}O$ exist in oxygen, and $^{17}O$ and $^{18}O$ account for about 0.037% and about 0.204% of all of the oxygen atoms in nature, respectively. That is to say, it is possible to estimate the concentrations of these isotopes by a method such as SIMS in the case where oxygen is intentionally added to the oxide semiconductor stack 403; therefore, the oxygen concentration in the oxide semiconductor stack 403 can be estimated more accurately in some cases by measuring the concentrations of these isotopes. Thus, the concentrations of these isotopes may be measured to determine whether oxygen is intentionally added to the oxide semiconductor stack 403.

Heat treatment is preferably performed after oxygen is added to the oxide semiconductor film.

In the case where oxygen is directly added to the oxide semiconductor stack 403 as in the transistor 430, the transistor 343, and the transistor 383 of this embodiment, the oxide insulating film 436 and the gate insulating film 402, which are in contact with the oxide semiconductor stack 403, do not necessarily contain a large amount of oxygen. A film having a high shielding effect (blocking effect) with respect to oxygen and impurities such as hydrogen and water is preferably provided as the insulating film 407 so that oxygen added to the oxide semiconductor stack 403 is not eliminated therefrom and impurities such as hydrogen and water do not enter the oxide semiconductor stack 403. For example, an aluminum oxide film or the like having a high shielding effect (blocking effect) with respect to oxygen and impurities such as hydrogen and water can be used.

Needless to say, oxygen may be supplied by a plurality of methods: for example, oxygen may be supplied by using films containing much oxygen as the oxide insulating film 436 and the gate insulating film 402 which are in contact with the oxide semiconductor film, and by direct addition of oxygen to the oxide semiconductor stack 403.

Although an example in which oxygen is added to the oxide semiconductor stack 403 is described in this embodiment, oxygen may be added to any of the gate insulating film 402, the oxide insulating film 436, and the insulating film 416 which are in contact with the oxide semiconductor stack 403, the insulating film 407, and the like. Oxygen is added to any of the gate insulating film 402, the oxide insulating film 436, and the insulating film 416 which are in contact with the oxide semiconductor stack 403, and the insulating film 407 so that the film is made to be an oxygen-excess film, whereby oxygen can be supplied to the oxide semiconductor stack 403.

As described above, a semiconductor device including an oxide semiconductor stack with stable electric characteristics can be provided. Accordingly, a highly reliable semiconductor device can be provided.

This embodiment can be implemented in appropriate combination with the other embodiments.

Embodiment 4

In this embodiment, another embodiment of a semiconductor device and a method for manufacturing the semiconductor device will be described with reference to FIGS. 6A to 6C. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

This embodiment shows, in a method for manufacturing a semiconductor device according to one embodiment of the disclosed invention, an example in which low-resistance regions are formed in an oxide semiconductor stack. The low-resistance regions can be formed by adding an impurity (also called a dopant) for changing the electrical conductivity to the oxide semiconductor stack.

Figure 6A:
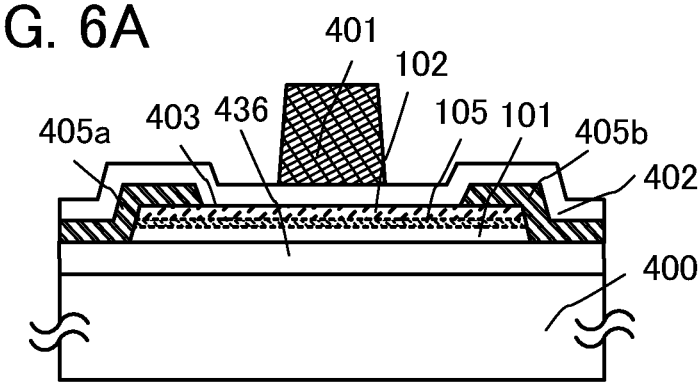
FIGS. 6A to 6C illustrate one embodiment of a semiconductor device and a method for manufacturing the semiconductor device.

FIG. 6A corresponds to FIG. 2D, in which, over the substrate 400 having an insulating surface, over which the oxide insulating film 436 is provided, the oxide semiconductor stack 403 including the first oxide semiconductor layer 101 and the second oxide semiconductor layer 102 with energy gaps different from each other and the mixed region 105 between the first oxide semiconductor layer 101 and the second oxide semiconductor layer 102, the source electrode layer 405a and the drain electrode layer 405b, the gate insulating film 402, and the gate electrode layer 401 are formed.

Next, a dopant 421 is selectively added to the oxide semiconductor stack 403 through the gate insulating film 402 and the source electrode layer 405a and the drain electrode layer 405b with the gate electrode layer 401 as a mask, so that low-resistance regions 121a, 121b, 122a, 122b, 125a, and 125b are formed.

In the example described in this embodiment, the source electrode layer 405a and the drain electrode layer 405b are each formed as a thin film, and thus the dopant 421 is also added to regions of the oxide semiconductor stack 403, which are under the source electrode layer 405a and the drain electrode layer 405b, so that the low-resistance regions 121a, 121b, 122a, 122b, 125a, and 125b are formed.

In some cases, the dopant 421 is not added to the regions of the oxide semiconductor stack 403, which are under the source electrode layer 405a and the drain electrode layer 405b, depending on the thickness of each of the source electrode layer 405a and the drain electrode layer 405b and the addition condition of the dopant 421. In such a case, even when the dopant 421 is added to the regions of the oxide semiconductor stack 403, which are under the source electrode layer 405a and the drain electrode layer 405b, the dopant concentrations of such regions are lower than those of the other regions in the oxide semiconductor stack 403 (low-resistance regions) and the resistances of such regions are higher than those of the other low-resistance regions in the oxide semiconductor stack 403 in some cases. Furthermore, in the case where the dopant 421 is added to only the first oxide semiconductor layer 101, only the second oxide semiconductor layer 102, or only the mixed region 105 depending on addition conditions of the dopant 421 to form the low-resistance regions, there is a difference in concentration distribution of the dopant between the first oxide semiconductor layer 101, the second oxide semiconductor layer 102, and the mixed region 105 in some cases.

The dopant 421 is an impurity by which the electrical conductivity of the oxide semiconductor stack 403 is changed. One or more selected from the following can be used as the dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant 421 is added to the oxide semiconductor stack 403 through the insulating film 407 and the source electrode layer 405a and the drain electrode layer 405b by an implantation method. As the method for adding the dopant 421, an ion implantation method, an ion doping method, a plasma immersion ion implantation method, or the like can be used. In that case, it is preferable to use a single ion of the dopant 421, a fluoride ion, or a chloride ion.

The addition of the dopant 421 can be controlled as appropriate by setting the addition conditions such as the accelerated voltage and the dosage, or the thickness of the insulating film 407 through which the dopant 421 passes. In this embodiment, boron is used as the dopant 421, whose ion is added by an ion implantation method. The dosage of the dopant 421 can be set to be greater than or equal to $1 \times 10^{13}$ ions/cm$^2$ and less than or equal to $5 \times 10^{16}$ ions/cm$^2$.

The concentration of the dopant 421 in the low-resistance region is preferably greater than or equal to $5\times10^{18}/cm^3$ and less than or equal to $1\times10^{22}/cm^3$.

The dopant 421 may be added while the substrate 400 is heated.

The addition of the dopant 421 to the oxide semiconductor stack 403 may be performed plural times, and the number of kinds of dopant may be plural.

Further, heat treatment may be performed after the addition of the dopant 421. The heat treatment is preferably performed at a temperature higher than or equal to 300° C. and lower than or equal to 700° C., more preferably higher than or equal to 300° C. and lower than or equal to 450° C., under an oxygen atmosphere for 1 hour. The heat treatment may be performed under a nitrogen atmosphere, reduced pressure, or the air (ultra-dry air).

In the case where the oxide semiconductor stack 403 is a crystalline oxide semiconductor film, part of the crystalline oxide semiconductor film becomes amorphous in some cases by addition of the dopant 421. In that case, the crystallinity of the oxide semiconductor stack 403 can be recovered by performing heat treatment after the addition of the dopant 421.

In the oxide semiconductor stack 403, accordingly, the first oxide semiconductor layer 101 where a channel formation region 121c is provided between the low-resistance regions 121a and 121b, the second oxide semiconductor layer 102 where a channel formation region 122c is provided between the low-resistance regions 122a and 122b, and the mixed region 105 where a channel formation region 125c is provided between the low-resistance regions 125a and 125b are formed.

Figure 6B:
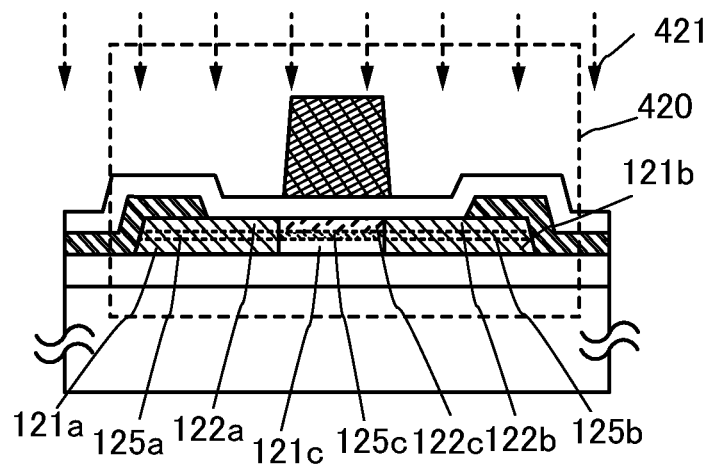

Through the above-described process, a transistor 420 of this embodiment is formed (see FIG. 6B).

Figure 3D:
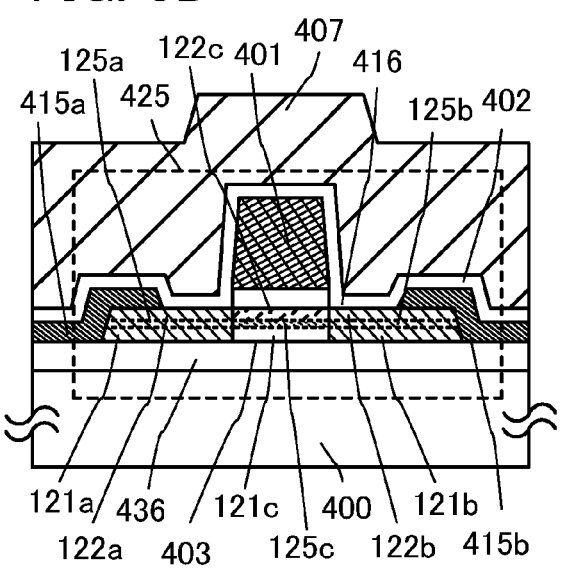

FIG. 3D illustrates a transistor 425 having a low-resistance region, which is formed by adding a dopant to a transistor in which the gate insulating film 402 is etched with the use of the gate electrode layer 401 as a mask so that the oxide semiconductor stack 403 is partly exposed to be in contact with the insulating film 416 as in the transistor 440d of Embodiment 1.

The transistor 425 is formed in a manner such that a dopant is added with the use of the gate insulating film 402 and the gate electrode layer 401 as masks to form the low-resistance regions 121a and 121b between which the channel formation region 121c is provided, the low-resistance regions 122a and 122b between which the channel formation region 122c is provided, and the low-resistance regions 125a and 125b between which the channel formation region 125c is provided. When the dopant is added to the transistor through the source electrode layer and the drain electrode layer, the dopant is also added to the source electrode layer and the drain electrode layer in some cases. The transistor 425 is an example of a transistor in which the dopant is also added to the source electrode layer and the drain electrode layer, thereby forming a source electrode layer 415a containing a dopant and a drain electrode layer 415b containing a dopant.

Since the oxide semiconductor stack 403 in each of the transistor 420 and the transistor 425 includes the first oxide semiconductor layer 101 where the low-resistance regions 121a and 121b are formed in the channel length direction with the channel formation region 121c provided therebetween, the second oxide semiconductor layer 102 where the low-resistance regions 122a and 122b are formed in the channel length direction with the channel formation region 122c provided therebetween, and the mixed region 105 where the low-resistance regions 125a and 125b are formed in the channel length direction with the channel formation region 125c provided therebetween, whereby on-state characteristics (e.g., on-state current and field effect mobility) of the transistor 420 and the transistor 425 are increased, which enables high-speed operation and high-speed response.

Figure 6C:
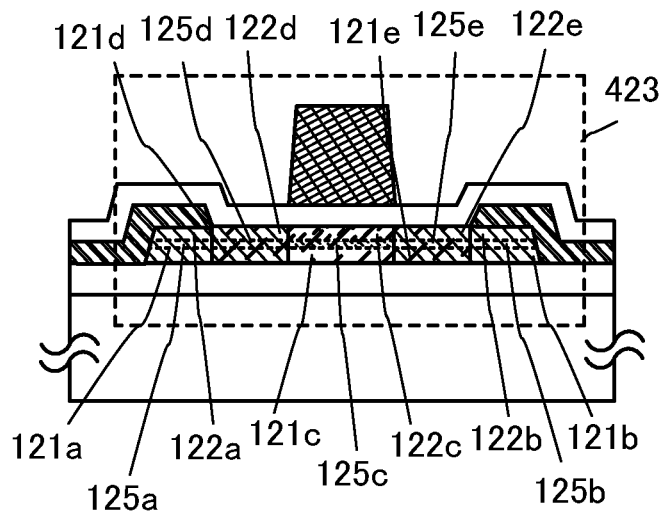

FIG. 6C illustrates a transistor 423 including a low-resistance region, which is formed by adding a dopant to the transistor 430 including the oxygen-excess region of Embodiment 3.

The transistor 423 is formed in a manner such that, with the use of the gate electrode layer 401 as a mask, a dopant is added to a transistor, which is provided with an oxide semiconductor stack which includes the first oxide semiconductor layer 101 including the oxygen-excess region 111, the second oxide semiconductor layer 102 including the oxygen-excess region 112, and the mixed region 105 including the oxygen-excess region 115 in a manner similar to that of the transistor 430 in FIG. 5C, to form low-resistance regions 121d and 121e including the dopant and the excessive oxygen and the low-resistance regions 121a and 121b including the dopant, between which the channel formation region 121c including the excessive oxygen is formed; low-resistance regions 122d and 122e including the dopant and the excessive oxygen and the low-resistance regions 122a and 122b including the dopant, between which the channel formation region 122c including the excessive oxygen is formed; and low-resistance regions 125d and 125e including the dopant and the excessive oxygen and the low-resistance regions 125a and 125b including the dopant, between which the channel formation region 125c including the excessive oxygen is formed.

The oxide semiconductor stack 403 in the transistor 423 includes the first oxide semiconductor layer 101 where the low-resistance regions 121d, 121e, 121a, and 121b are formed in the channel length direction with the channel formation region 121c provided therebetween, the second oxide semiconductor layer 102 where the low-resistance regions 122d, 122e, 122a, and 122b are formed in the channel length direction with the channel formation region 122c provided therebetween, and the mixed region 105 where the low-resistance regions 125d, 125e, 125a, and 125b are formed in the channel length direction with the channel formation region 125c provided therebetween, whereby on-state characteristics (e.g., on-state current and field effect mobility) of the transistor 423 are increased, which enables high-speed operation and high-speed response.

Figure 10A:
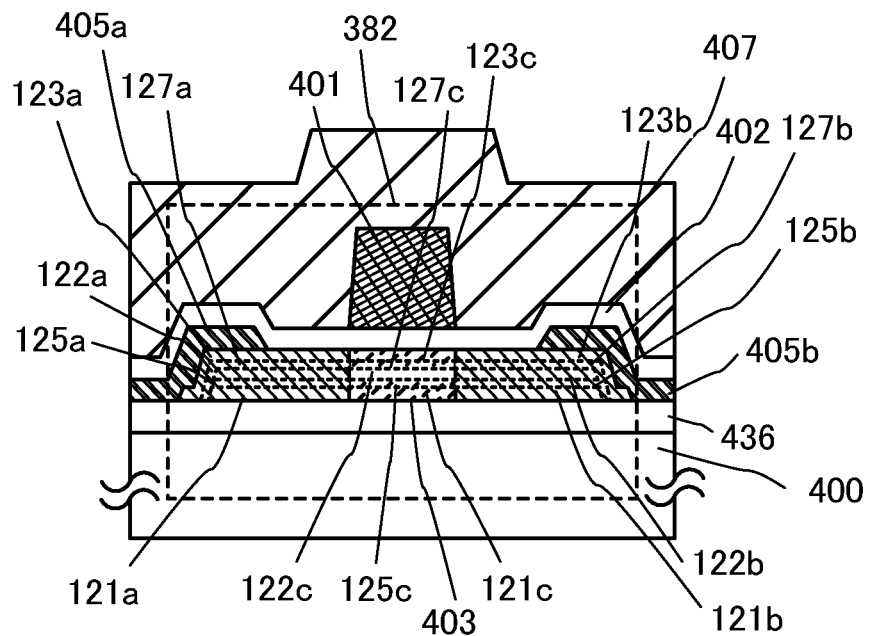
FIGS. 10A and 10B each illustrate one embodiment of a semiconductor device.

FIG. 10A illustrates a transistor 382 which is obtained in a manner such that, in order to form low-resistance regions, a dopant is added to the transistor in a manner similar to that of the transistor 380a described in Embodiment 2, in which the oxide semiconductor stack 403 has a three layered structure in which the upper oxide semiconductor layer covers the side surfaces of the lower oxide semiconductor layers.

The transistor 382 is formed as follows: after the gate electrode layer 401 is formed, the dopant is added to the oxide semiconductor stack 403 including the first oxide semiconductor layer 101, the second oxide semiconductor layer 102, and the third oxide semiconductor layer 103 and the mixed region 105 between the first oxide semiconductor layer 101 and the second oxide semiconductor layer 102 and the mixed region 107 between the second oxide semiconductor layer 102 and the third oxide semiconductor layer 103. The dopant is added to the oxide semiconductor stack 403 using the gate electrode layer 401 as a mask to form low-resistance regions 121a, 121b, 122a, 122b, 123a, 123b, 125a, 125b, 127a, and 127b including the dopant. The channel formation region 121c is formed between the low-resistance regions 121a and 121b including the dopant. The channel formation region 122c is formed between the low-resistance regions 122a and 122b including the dopant. A channel formation region 123c is formed between the low-resistance regions 123a and 123b including the dopant. The channel formation region 125c is formed between the low-resistance regions 125a and 125b including the dopant. A channel formation region 127c is formed between the low-resistance regions 127a and 127b including the dopant.

The oxide semiconductor stack 403 in the transistor 382 includes the first oxide semiconductor layer 101 where the low-resistance regions 121a and 121b are formed in the channel length direction with the channel formation region 121c provided therebetween, the second oxide semiconductor layer 102 where the low-resistance regions 122a and 122b are formed in the channel length direction with the channel formation region 122c provided therebetween, the third oxide semiconductor layer 103 where the low resistance region 123a and 123b are formed in the channel length direction with the channel formation region 123c provided therebetween, the mixed region 105 where the low-resistance regions 125a and 125b are formed in the channel length direction with the channel formation region 125c provided therebetween, and the mixed region 107 where the low-resistance regions 127a and 127b are formed in the channel length direction with the channel formation region 127c provided therebetween, whereby on-state characteristics (e.g., on-state current and field effect mobility) of the transistor 382 are increased, which enables high-speed operation and high-speed response.

Figure 4B:
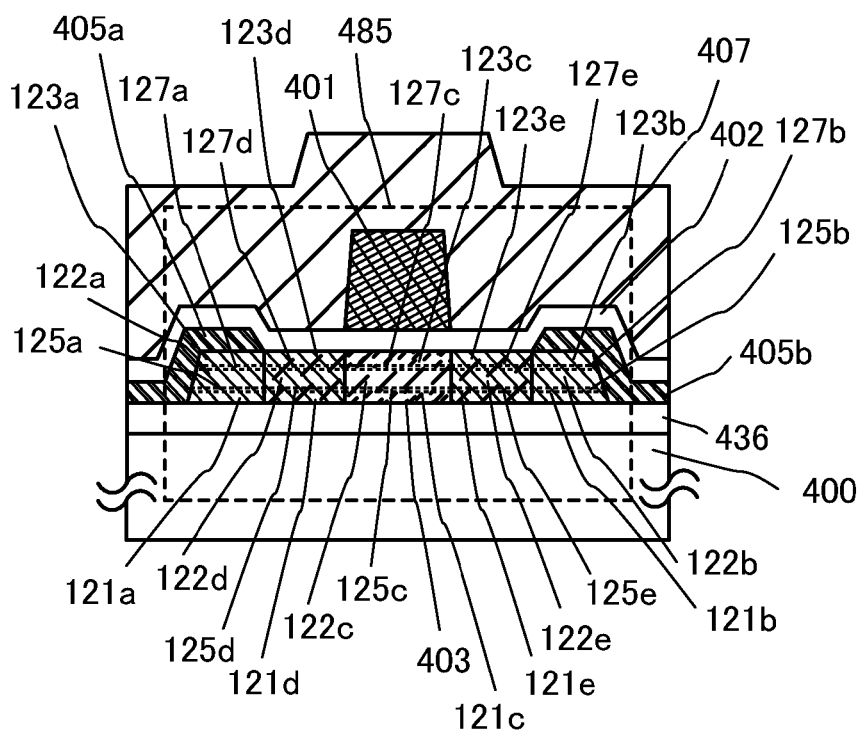
Figure 10B:
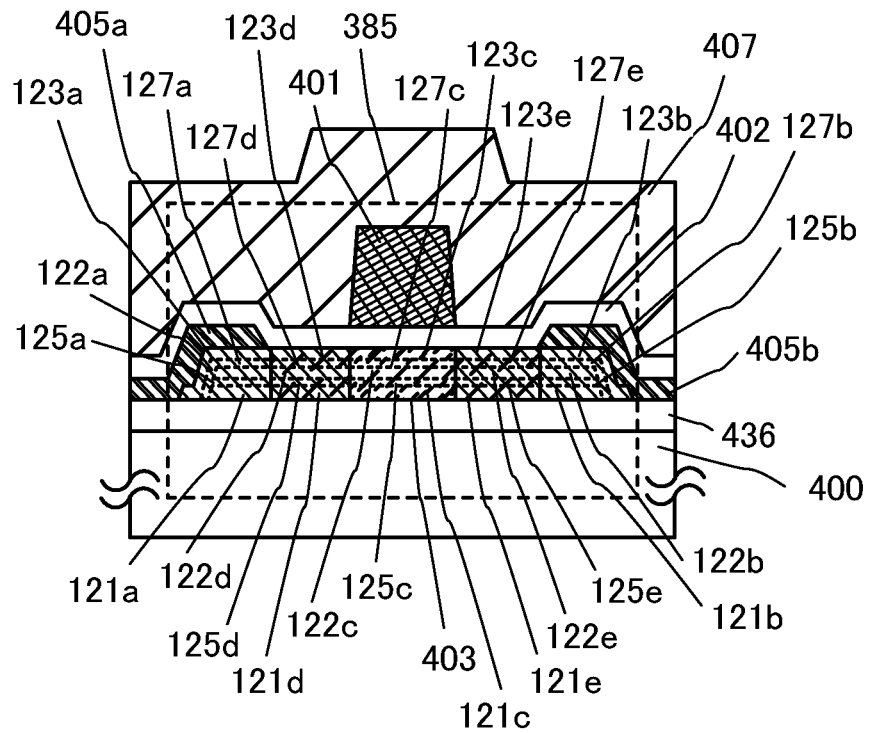

FIG. 4B illustrates a transistor 485 and FIG. 10B illustrates a transistor 385 which are each obtained in a manner such that, in order to form oxygen-excess regions and low-resistance regions, oxygen and a dopant are added to the transistor in a manner similar to that of the transistor 480 described in Embodiment 1 and the transistor 380a described in Embodiment 2, in which the oxide semiconductor stack 403 has a three layered structure. Further, in the transistor 385, the upper oxide semiconductor layer covers the side surfaces of the lower oxide semiconductor layers in the oxide semiconductor stack 403.

The transistor 485 and the transistor 385 are each formed as follows. In order to form oxygen-excess regions, oxygen is added to the oxide semiconductor stack 403 including the first oxide semiconductor layer 101, the second oxide semiconductor layer 102, and the third oxide semiconductor layer 103 and the mixed region 105 between the first oxide semiconductor layer 101 and the second oxide semiconductor layer 102 and the mixed region 107 between the second oxide semiconductor layer 102 and the third oxide semiconductor layer 103. After the gate electrode layer 401 is formed, the dopant is added to the oxide semiconductor stack 403 using the gate electrode layer 401 as a mask to form low-resistance regions 121d, 121e, 122d, 122e, 123d, 123e, 125d, 125e, 127d, and 127e including the dopant and the excess oxygen; and low-resistance regions 121a, 121b, 122a, 122b, 123a, 123b, 125a, 125b, 127a, and 127b including the dopant. The channel formation region 121c including the excess oxygen is formed between the low-resistance regions 121d and 121e including the dopant and the excess oxygen, which are formed between the low-resistance regions 121a and 121b including the dopant. The channel formation region 122c including the excess oxygen is formed between the low-resistance regions 122d and 122e including the dopant and the excess oxygen, which are formed between the low-resistance regions 122a and 122b including the dopant. The channel formation region 123c including the excess oxygen is formed between the low-resistance regions 123d and 123e including the dopant and the excess oxygen, which are formed between the low-resistance regions 123a and 123b including the dopant. The channel formation region 125c including the excess oxygen is formed between the low-resistance regions 125d and 125e including the dopant and the excess oxygen, which are formed between the low-resistance regions 125a and 125b including the dopant. The channel formation region 127c including the excess oxygen is formed between the low-resistance regions 127d and 127e including the dopant and the excess oxygen, which are formed between the low-resistance regions 127a and 127b including the dopant.

The oxide semiconductor stack 403 in each of the transistor 485 and the transistor 385 includes the first oxide semiconductor layer 101 where the low-resistance regions 121d, 121e, 121a, and 121b are formed in the channel length direction with the channel formation region 121c provided therebetween, the second oxide semiconductor layer 102 where the low-resistance regions 122d, 122e, 122a, and 122b are formed in the channel length direction with the channel formation region 122c provided therebetween, the third oxide semiconductor layer 103 where the low resistance region 123d, 123e, 123a, and 123b are formed in the channel length direction with the channel formation region 123c provided therebetween, the mixed region 105 where the low-resistance regions 125d, 125e, 125a, and 125b are formed in the channel length direction with the channel formation region 125c provided therebetween, and the mixed region 107 where the low-resistance regions 127d, 127e, 127a, and 127b are formed in the channel length direction with the channel formation region 127c provided therebetween, whereby on-state characteristics (e.g., on-state current and field effect mobility) of the transistor 485 and the transistor 385 are increased, which enables high-speed operation and high-speed response.

In the transistor 420, the transistor 423, the transistor 425, the transistor 382, the transistor 485, and the transistor 385, the low-resistance regions 121a, 121b, 122a, 122b, 125a, and 125b (in the transistor 382, the transistor 485, and the transistor 385, the low-resistance regions 121a, 121b, 122a, 122b, 123a, 123b, 125a, 125b, 127a, and 127b) can each function as a source region or a drain region. By providing the low-resistance regions 121a, 121b, 122a, 122b, 125a, and 125b (in the transistor 382, the transistor 485, and the transistor 385, the low-resistance regions 121a, 121b, 122a, 122b, 123a, 123b, 125a, 125b, 127a, and 127b), the electrical field applied to the channel formation region 121c formed between the low-resistance regions 121a and 121b, the channel formation region 122c formed between the low-resistance regions 122a and 122b, and the channel formation region 125c formed between the low-resistance regions 125a and 125b (in the transistor 382, the transistor 485, and the transistor 385, the channel formation region 121c formed between the low-resistance regions 121a and 121b, the channel formation region 122c formed between the low-resistance regions 122a and 122b, the channel formation region 123c formed between the low-resistance regions 123a and 123b, the channel formation region 125c formed between the low-resistance regions 125a and 125b, and the channel formation region 127c formed between the low-resistance regions 127a and 127b) can be alleviated. Further, electrical connection between the oxide semiconductor stack 403 and each of the source electrode layer 405a and the drain electrode layer 405b in the low-resistance regions 121a, 121b, 122a, 122b, 125a, and 125b (in the transistor 382, the transistor 485, and the transistor 385, the low-resistance regions 121a, 121b, 122a, 122b, 123a, 123b, 125a, 125b, 127a, and 127b) can reduce the contact resistance between the oxide semiconductor stack 403 and each of the source electrode layer 405a and the drain electrode layer 405b. Consequently, the electric characteristics of the transistors can be enhanced.

Note that in the oxide semiconductor stack in which the oxide semiconductor layer whose energy gap is larger than the energy gap of the lower oxide semiconductor layer is stacked as an upper layer, the upper oxide semiconductor layer covers the side surfaces of the lower oxide semiconductor layer, whereby generation of the leakage current between the source electrode layer and the drain electrode layer of the transistor (parasitic channel) can be reduced.

This embodiment can be implemented in appropriate combination with the other embodiments.

Embodiment 5

A semiconductor device (also referred to as a display device) having a display function can be manufactured using the transistor an example of which is described in any of Embodiments 1 to 4. Moreover, part or all of the driver circuit which includes the transistor can be formed over a substrate where a pixel portion is formed, whereby a system-on-panel can be formed.

Figure 12A:
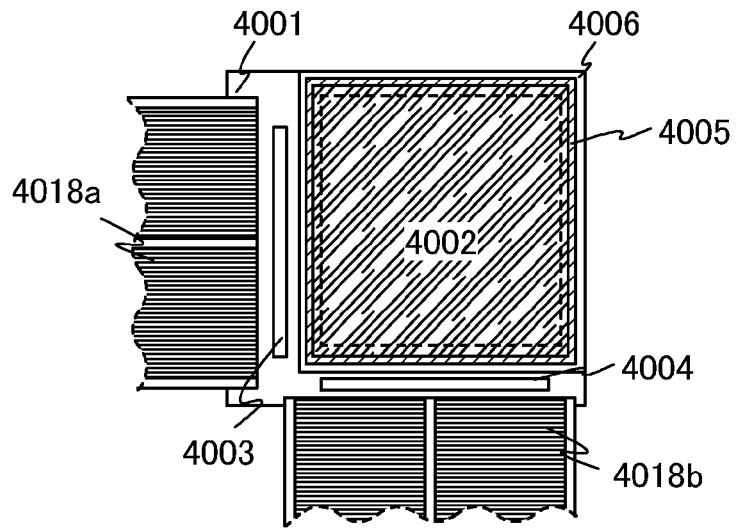
FIGS. 12A to 12C each illustrate one embodiment of a semiconductor device.

In FIG. 12A, a sealant 4005 is provided so as to surround a pixel portion 4002 provided over a first substrate 4001, and the pixel portion 4002 is sealed with a second substrate 4006. In FIG. 12A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003 and the scan line driver circuit 4004 which are separately formed and the pixel portion 4002 from flexible printed circuits (FPCs) 4018a and 4018b.

Figure 12B:
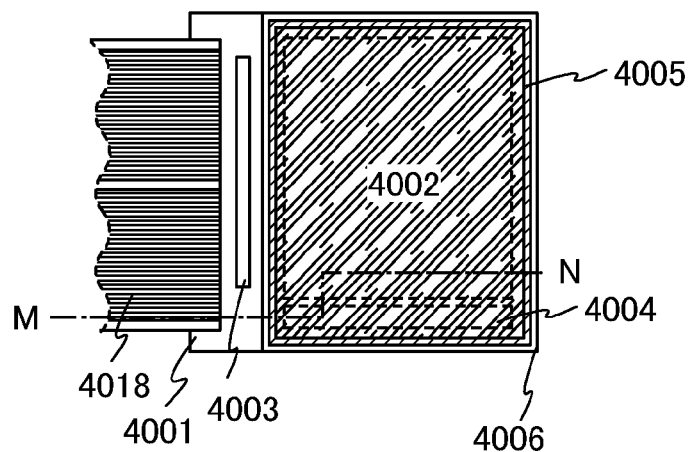
Figure 12C:
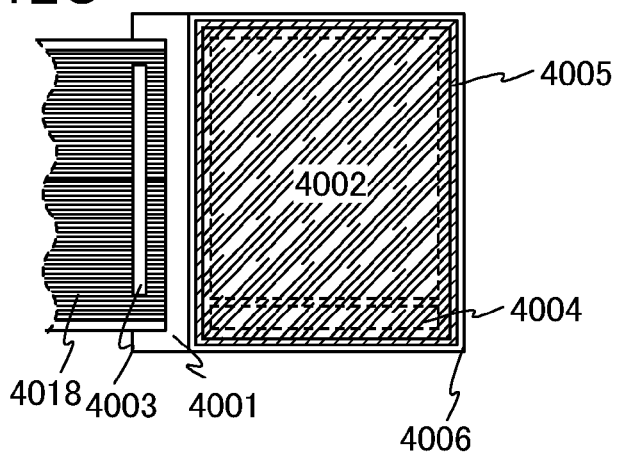

In FIGS. 12B and 12C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 12B and 12C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 12B and 12C, a variety of signals and potentials are supplied to the signal line driver circuit 4003 and the scan line driver circuit 4004 which are separately formed and the pixel portion 4002 from an FPC 4018.

Although FIGS. 12B and 12C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or only part of the scan line driver circuit may be formed separately and then mounted.

The connection method of such a separately formed driver circuit is not particularly limited; for example, a chip on glass (COG) method, a wire bonding method, or a tape automated bonding (TAB) method can be used. FIG. 12A illustrates an example in which the signal line driver circuit 4003 and the scan line driver circuit 4004 are mounted by a COG method; FIG. 12B illustrates an example in which the signal line driver circuit 4003 is mounted by a COG method; and FIG. 12C illustrates an example in which the signal line driver circuit 4003 is mounted by a TAB method.

The display device includes in its category a panel in which a display element is sealed, and a module in which an IC including a controller or the like is mounted on the panel.

The display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors and transistors examples of which are described in any of Embodiments 1 to 4 can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically includes an inorganic electroluminescent (EL) element, an organic EL element, and the like. A display medium whose contrast is changed by an electric effect, such as electronic ink, can also be used.

One embodiment of a semiconductor device is described with reference to FIGS. 12A to 12C and FIGS. 13A and 13B. FIGS. 13A and 13B are cross-sectional views taken along the line M-N of FIG. 12B.

As illustrated in FIGS. 12A to 12C and FIGS. 13A and 13B, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as a source electrode layer and a drain electrode layer of a transistor 4010 and a transistor 4011.

Each of the pixel portion 4002 and the scan line driver circuit 4004 which are provided over the first substrate 4001 includes a plurality of transistors. In FIGS. 12A to 12C and FIGS. 13A and 13B, the transistor 4010 included in the pixel portion 4002 and the transistor 4011 included in the scan line driver circuit 4004 are illustrated as an example. An insulating film 4020 is provided over the transistor 4010 and the transistor 4011 in FIG. 13A, and an insulating film 4021 is further provided in FIG. 13B. An insulating film 4023 is an insulating film which serves as a base film.

Any of the transistors described in Embodiments 1 to 4 can be applied to the transistor 4010 and the transistor 4011. In this embodiment, an example in which a transistor having a structure similar to that of the transistor 440a described in Embodiment 1 is used is described.

The transistor 4010 and the transistor 4011 are transistors each including an oxide semiconductor stack which includes at least two oxide semiconductor layers with energy gaps different from each other and a mixed region between the stacked oxide semiconductor layers. The oxide semiconductor stack includes a plurality of oxide semiconductor layers with energy gaps different from each other or one another, whereby electric characteristics of the transistor 4010 and the transistor 4011 can be accurately controlled, and accordingly desired electric characteristics can be given to the transistor 4010 and the transistor 4011.

Therefore, a semiconductor device which meets various purposes such as high performance, high reliability, and low power consumption can be provided as the semiconductor device of this embodiment illustrated in FIG. 12A to 12C and FIGS. 13A and 13B.

The transistor 4010 included in the pixel portion 4002 is electrically connected to a display element to constitute a part of a display panel. There is no particular limitation on the kind of the display element as long as display can be performed, and various kinds of display elements can be used.

An example of a liquid crystal display device using a liquid crystal element as a display element is illustrated in FIG. 13A. In FIG. 13A, a liquid crystal element 4013 which is a display element includes a first electrode layer 4030, a second electrode layer 4031, and a liquid crystal layer 4008. An insulating film 4032 and an insulating film 4033 which serve as orientation films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

A columnar spacer denoted by reference numeral 4035 is obtained by selective etching of an insulating film and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is not used may be used for the liquid crystal layer 4008. The blue phase is one of liquid crystal phases, which is generated just before a cholesteric phase changes into an isotropic phase while temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer can be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, so that the alignment process is not necessary and the viewing angle dependence is small. In addition, since an alignment film does not need to be provided and thus rubbing treatment is not necessary, electrostatic discharge damage caused by the rubbing treatment can be prevented and defects and damage of the liquid crystal display device in the manufacturing process can be reduced. Thus, the productivity of the liquid crystal display device can be improved. A transistor including an oxide semiconductor film has a possibility that the electric characteristics of the transistor may fluctuate significantly by the influence of static electricity and deviate from the designed range. Therefore, it is more effective to use a liquid crystal composition exhibiting a blue phase for the liquid crystal display device including the transistor including an oxide semiconductor film.

The specific resistivity of the liquid crystal material is greater than or equal to $1\times10^9$ Ω·cm, preferably greater than or equal to $1\times10^{11}$ Ω·cm, more preferably greater than or equal to $1\times10^{12}$ Ω·cm. The specific resistivity in this specification is measured at 20° C.

The magnitude of a storage capacitor in the liquid crystal display device is set considering the leakage current of the transistor in the pixel portion or the like so that charge can be held for a predetermined period. The magnitude of the storage capacitor may be set considering the off-state current of the transistor or the like. By using a transistor including an oxide semiconductor film disclosed in this specification, a capacitance that is ⅓ or less, preferably ⅕ or less of liquid crystal capacitance of each pixel is enough as the magnitude of the storage capacitor.

In the transistor including an oxide semiconductor film disclosed in this specification, the current in an off state (off-state current) can be suppressed to be small. Accordingly, an electric signal such as an image signal can be held for a longer period, and a writing interval can be set longer in an on state. The frequency of refresh operation can be accordingly reduced, which leads to an effect of suppressing power consumption.

Further, in the transistor including an oxide semiconductor film disclosed in this specification, the field-effect mobility can be controlled to be high; thus, the transistor can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided. Accordingly, the reliability of the semiconductor device can also be improved.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode; for example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between respective dots of color elements. The disclosed invention is not limited to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. This light-emitting element is called a current-excitation light-emitting element owing to such a mechanism.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An organic EL element is used as the light-emitting element for description here.

To extract light emitted from the light-emitting element, it is necessary that at least one of the pair of electrodes have a light-transmitting property. A transistor and the light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side; a light-emitting element having any of these emission structures can be used.

An example of a light-emitting device in which a light-emitting element is used as a display element is illustrated in FIG. 13B. A light-emitting element 4513 which is the display element is electrically connected to the transistor 4010 provided in the pixel portion 4002. A structure of the light-emitting element 4513 is not limited to the stacked-layer structure illustrated in FIG. 13B, which is the layered structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 is formed using an organic insulating material or an inorganic insulating material. It is preferable that the partition wall 4510 be formed using a photosensitive resin material and have an opening over the first electrode layer 4030 so that a sidewall of the opening is formed as a tilted surface with continuous curvature.

The electroluminescent layer 4511 has either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that the light-emitting element 4513 be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. For example, nitrogen is used as the filler.

In addition, if necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions on the surface so as to reduce the glare can be performed.

Further, electronic paper in which electronic ink is driven can be provided as the display device. The electronic paper is also called electrophoretic display device (electrophoretic display) and is advantageous in that it exhibits the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. The first particles and the second particles each contain a pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Further, by using a color filter or particles that have a pigment, color display can also be achieved.

The first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 12A to 12C and FIGS. 13A and 13B, a flexible substrate as well as a glass substrate can be used as the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where the light-transmitting property is not necessary, a metal substrate (metal film) of aluminum, stainless steel, or the like may be used. For example, a sheet with a structure in which an aluminum foil is sandwiched between PVF films or polyester films can be used.

In this embodiment, an aluminum oxide film is used as the insulating film 4020.

The aluminum oxide film which is provided as the insulating film 4020 over the oxide semiconductor film has a high blocking effect by which both of oxygen and impurities such as hydrogen or moisture is prevented from being permeated through the film.

Therefore, in and after the manufacturing process, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

The insulating film 4021 which serves as a planarization insulating film can be formed using an organic material having heat resistance, such as an acrylic resin, polyimide, a benzocyclobutene-based resin, polyamide, or an epoxy resin. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed of these materials.

There is no particular limitation on the method of forming the insulating film 4021, and the following method or tool (equipment) can be used depending on the material: a sputtering method, an SOG method, spin coating, dipping, spray coating, a droplet discharge method (such as an ink jet method), a printing method (such as screen printing or offset printing), a doctor knife, a roll coater, a curtain coater, a knife coater, or the like.

The display device displays an image by transmitting light from the light source or the display element. Therefore, the substrate and the thin films such as the insulating film and the conductive film provided for the pixel portion where light is transmitted have light-transmitting properties with respect to light in the visible light wavelength range.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride of these metals.

A conductive composition containing a conductive high molecule (also called a conductive polymer) can be used for the first electrode layer 4030 and the second electrode layer 4031. As the conductive high molecule, a so-called $\pi$-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is likely to be broken owing to static electricity or the like, a protection circuit for protecting the driver circuit is preferably provided. The protection circuit is preferably formed using a nonlinear element.

By applying any of the transistors described in Embodiments 1 to 4 as described above, semiconductor devices having a variety of functions can be provided.

Embodiment 6

A semiconductor device having an image sensor function for reading data of an object can be formed with the use of the transistor an example of which is described in any of Embodiments 1 to 4.

Figure 14A:
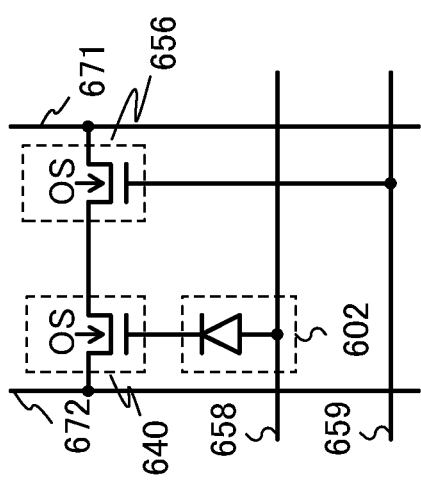
FIGS. 14A and 14B illustrate one embodiment of a semiconductor device.
Figure 14B:
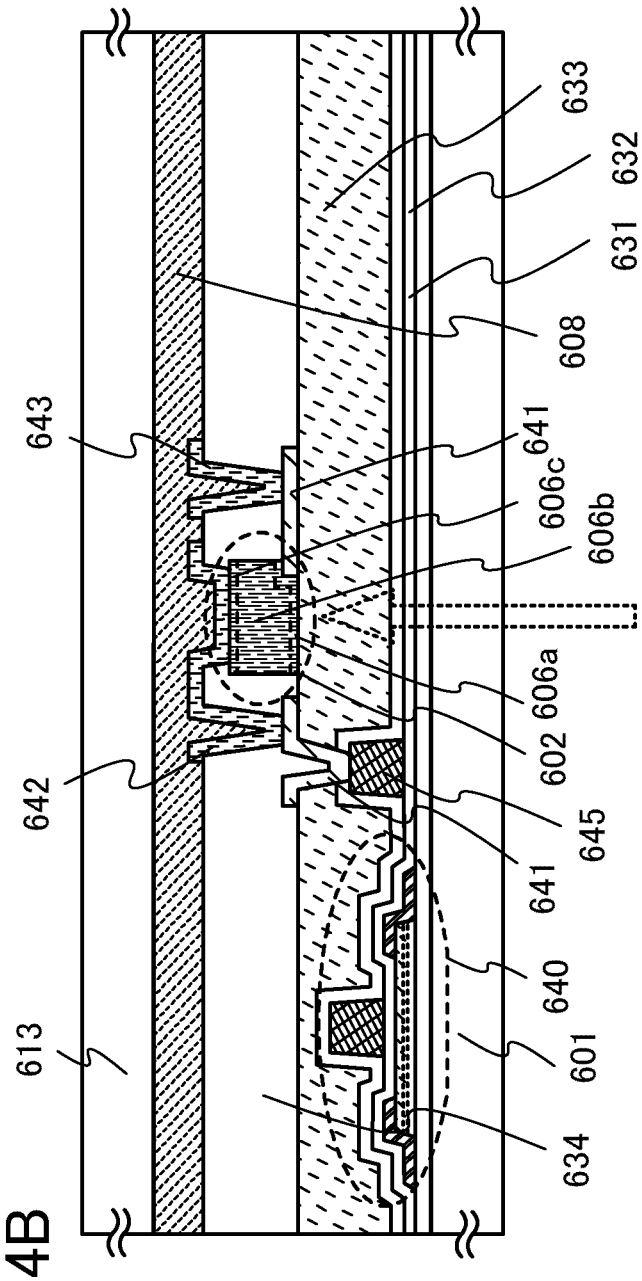

FIG. 14A illustrates an example of a semiconductor device having an image sensor function. FIG. 14A is an equivalent circuit diagram of a photosensor, and FIG. 14B is a cross-sectional diagram of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

In the circuit diagrams in this specification, a transistor including an oxide semiconductor film is denoted by a symbol "OS" so that it can be clearly identified as a transistor including an oxide semiconductor film. In FIG. 14A, the transistor 640 and the transistor 656 are transistors each including an oxide semiconductor film, to which any of the transistors described in Embodiments 1 to 4 can be applied.

Described in this embodiment is an example in which a transistor having a structure similar to that of the transistor 440a described in Embodiment 1 is used.

FIG. 14B is a cross-sectional diagram of the photodiode 602 and the transistor 640 in the photosensor. The transistor 640 and the photodiode 602 functioning as a sensor are provided over a substrate 601 (TFT substrate) having an insulating surface. A substrate 613 is provided over the photodiode 602 and the transistor 640 with the use of an adhesive layer 608.

An insulating film 631, an insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are stacked in this order from the interlayer insulating film 633 side, between an electrode layer 641 formed over the interlayer insulating film 633 and an electrode layer 642 formed over the interlayer insulating film 634.

The electrode layer 641 is electrically connected to a conductive layer 643 formed over the interlayer insulating film 634, and the electrode layer 642 is electrically connected to a conductive layer 645 through the electrode layer 641. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma-enhanced CVD method with the use of a semiconductor source gas containing an impurity element belonging to Group 13 (e.g., boron (B)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed after the impurity element is added by an ion implantation method or the like to diffuse the impurity element. In that case, as a method of forming the amorphous silicon film, an LPCVD method, a vapor deposition method, a sputtering method, or the like is used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma-enhanced CVD method with the use of a semiconductor source gas. As the semiconductor source gas, silane ($SiH_4$) can be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma-enhanced CVD method with the use of a semiconductor source gas containing an impurity element belonging to Group 15 (e.g., phosphorus (P)). As the semiconductor source gas, silane ($SiH_4$) can be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like can be performed after the impurity element is added by an ion implantation method or the like to diffuse the impurity element. In that case, as the method of forming the amorphous silicon film, an LPCVD method, a chemical vapor deposition method, a sputtering method, or the like is used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

Considering Gibbs free energy, the microcrystalline semiconductor is in a metastable state that is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 at. % in order to terminate a dangling bond. Moreover, microcrystalline silicon contains a rare gas element such as helium, argon, krypton, or neon to further promote lattice distortion, so that the stability is increased and thus a favorable microcrystalline semiconductor film can be obtained.

This microcrystalline semiconductor film can be formed by a radio-frequency plasma-enhanced CVD method with a frequency of greater than or equal to several tens of megahertz and less than or equal to several hundreds of megahertz, or a microwave plasma-enhanced CVD apparatus with a frequency of greater than or equal to 1 GHz. As a typical example, the microcrystalline semiconductor can be formed using a compound containing silicon such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as $CH_4$ or $C_2H_6$, a germanium gas such as GeH$_4$ or GeF$_4$, F$_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is formed using a light-blocking conductive film. A surface on the n-type semiconductor film side can alternatively be used as the light-receiving plane.

With the use of an insulating material, the insulating film 632, the interlayer insulating film 633, and the interlayer insulating film 634 can be formed, depending on the material, by a method or a tool (equipment) such as a sputtering method, a plasma-enhanced CVD method, an SOG method, spin coating, dipping, spray coating, a droplet discharge method (such as an ink jet method), a printing method (such as screen printing or offset printing), a doctor knife, a roll coater, a curtain coater, or a knife coater.

In this embodiment, an aluminum oxide film is used as the insulating film 631. The insulating film 631 can be formed by a sputtering method or a plasma-enhanced CVD method.

The aluminum oxide film which is provided as the insulating film 631 over the oxide semiconductor film has a high blocking effect by which both of oxygen and impurities such as hydrogen or moisture is prevented from being permeated through the film.

Therefore, in and after the manufacturing process, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

The insulating film 632 can be formed using an inorganic insulating material and can have a single-layer structure or a layered structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

To reduce surface roughness, an insulating film functioning as a planarization insulating film is preferably used as each of the interlayer insulating film 633 and the interlayer insulating film 634. For the interlayer insulating film 633 and the interlayer insulating film 634, for example, an organic insulating material having heat resistance, such as polyimide, an acrylic resin, a benzocyclobutene-based resin, polyamide, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light that enters the photodiode 602, data on an object to be detected can be read. A light source such as a backlight can be used at the time of reading data on the object to be detected.

Accordingly, as a semiconductor layer, an oxide semiconductor stack includes a plurality of oxide semiconductor layers with energy gaps different from each other or one another and a mixed region between the plurality of oxide semiconductor layers, whereby electric characteristics of a transistor can be accurately controlled, and accordingly desired electric characteristics can be given to the transistor. Accordingly, by using the transistor, a semiconductor device which meets various purposes such as high performance, high reliability, and low power consumption can be provided.

This embodiment can be implemented in appropriate combination with the other embodiments.

Embodiment 7

The transistor an example of which is described in any of Embodiments 1 to 4 can be preferably used for a semiconductor device including an integrated circuit in which a plurality of transistors is stacked. In this embodiment, as an example of the semiconductor device, a memory medium (memory element) will be described.

Manufactured in this embodiment is a semiconductor device which includes a transistor 140 which is a first transistor formed using a single crystal semiconductor substrate and a transistor 162 which is a second transistor formed using a semiconductor film and provided above the transistor 140 with an insulating film provided therebetween. The transistor an example of which is described in any of Embodiments 1 to 3 can be preferably used as the transistor 162. Described in this embodiment is an example in which a transistor having a structure similar to that of the transistor 440a described in Embodiment 1 is used as the transistor 162.

Semiconductor materials and structures of the transistor 140 and the transistor 162, which are stacked, may be the same as or different from each other. In this embodiment, an example is described in which materials and structures which are appropriate for the circuit of the memory medium (memory element) are employed for the transistors.

Figure 15A:
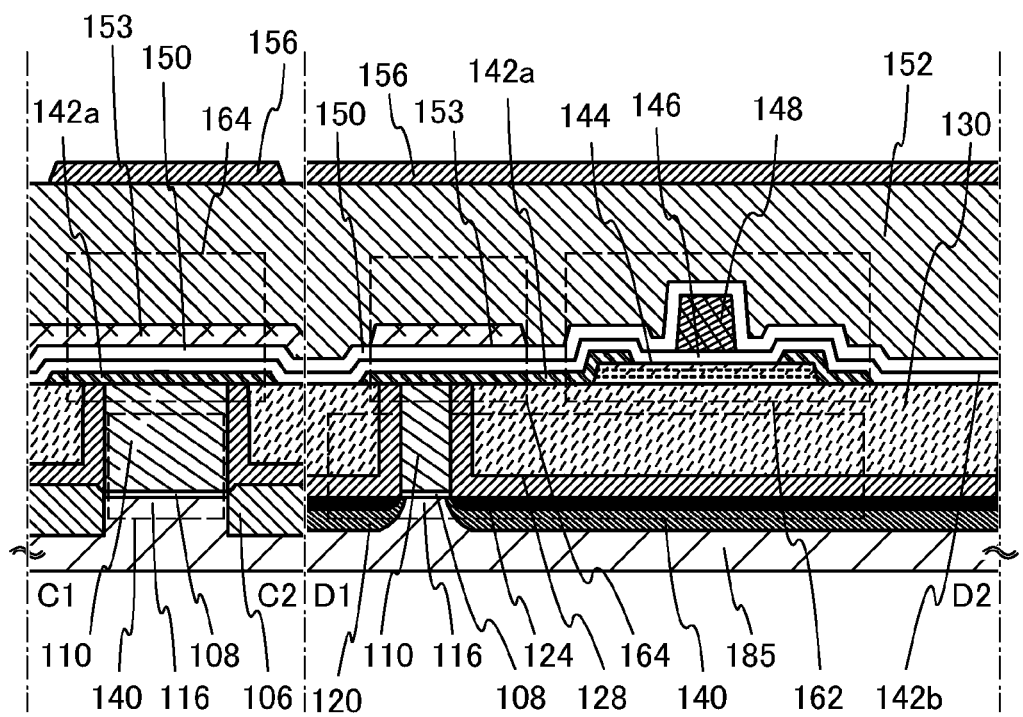
FIGS. 15A to 15C illustrate one embodiment of a semiconductor device.
Figure 15B:
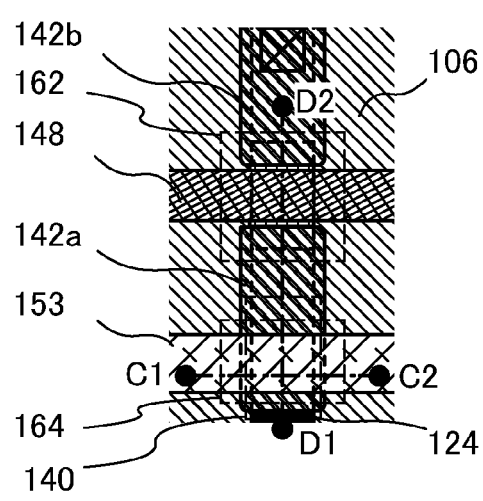
Figure 15C:
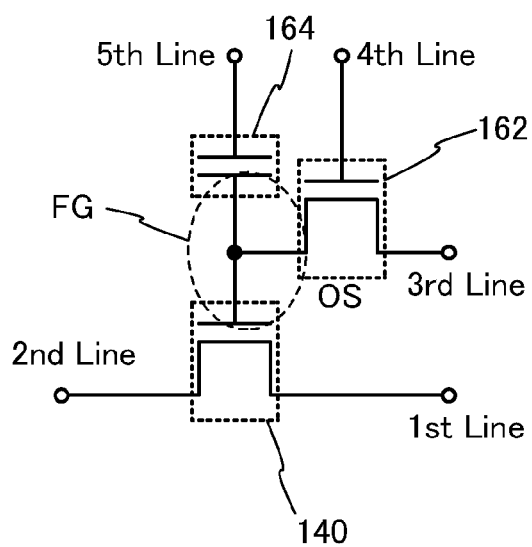

In FIGS. 15A to 15C, an example of the structure of the semiconductor device is illustrated. FIG. 15A illustrates a cross section of the semiconductor device, and FIG. 15B is a top view of the semiconductor device. Here, FIG. 15A corresponds to a cross section taken along the line C1-C2 and line D1-D2 in FIG. 15B. In addition, FIG. 15C is an example of a diagram of a circuit using the semiconductor device as a memory element. The semiconductor device illustrated in FIGS. 15A and 15B includes the transistor 140 using a first semiconductor material in a lower portion, and the transistor 162 using a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, a compound semiconductor material such as silicon germanium, silicon carbide, or gallium arsenide, or the like can be used, and a single crystal semiconductor is preferably used. Alternatively, an organic semiconductor material or the like may be used. A transistor using such a semiconductor material can operate at high speed easily. On the other hand, a transistor using an oxide semiconductor enables charge to be held for a long time owing to its characteristics.

A method for manufacturing the semiconductor device in FIGS. 15A to 15C is described with reference to FIGS. 15A to 15C.

The transistor 140 includes a channel formation region 116 provided in a substrate 185 containing a semiconductor material (e.g., silicon), impurity regions 120 provided so that the channel formation region 116 is provided therebetween, metal compound regions 124 in contact with the impurity regions 120, a gate insulating film 108 provided over the channel formation region 116, and a gate electrode 110 provided over the gate insulating film 108.

As the substrate 185 containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Although the "SOI substrate" generally means a substrate in which a silicon semiconductor film is provided on an insulating surface, the "SOI substrate" in this specification and the like also includes in its category a substrate in which a semiconductor film formed using a material other than silicon is provided on an insulating surface. That is, a semiconductor film included in the "SOI substrate" is not limited to a silicon semiconductor film. Moreover, the SOI substrate can have a structure in which a semiconductor film is provided over an insulating substrate such as a glass substrate with an insulating film provided therebetween.

As a method of forming the SOI substrate, any of the following methods can be used: a method in which oxygen ions are added to a mirror-polished wafer and then heating is performed thereon at a high temperature, whereby an oxide layer is formed at a certain depth from a top surface of the wafer and a defect caused in the surface layer is eliminated; a method in which a semiconductor substrate is separated by utilizing growth of microvoids formed by hydrogen ion irradiation, by heat treatment; a method in which a single crystal semiconductor film is formed over an insulating surface by crystal growth; and the like.

For example, ions are added through one surface of a single crystal semiconductor substrate, so that an embrittlement layer is formed at a certain depth from a surface of the single crystal semiconductor substrate, and an insulating film is formed over one of the surface of the single crystal semiconductor substrate and an element substrate. Heat treatment is performed in a state where the single crystal semiconductor substrate and the element substrate are bonded to each other with the insulating film provided therebetween, so that a crack is generated in the embrittlement layer and the single crystal semiconductor substrate is separated along the embrittlement layer. Accordingly, a single crystal semiconductor film, which is separated from the single crystal semiconductor substrate, is formed as a semiconductor film over the element substrate. An SOI substrate formed by the above method can also be preferably used.

An element isolation insulating layer 106 is provided over the substrate 185 so as to surround the transistor 140. For high integration, it is preferable that, as in FIGS. 15A to 15C, the transistor 140 do not include a sidewall insulating layer. On the other hand, in the case where the characteristics of the transistor 140 have priority, a sidewall insulating layer may be provided on a side surface of the gate electrode 110, and the impurity region 120 including a region having a different impurity concentration may be provided.

The transistor 140 formed using a single crystal semiconductor substrate can operate at high speed. Thus, the use of the transistor as a reading transistor enables data to be read at high speed. Two insulating films are formed so as to cover the transistor 140. As treatment prior to formation of the transistor 162 and a capacitor 164, CMP treatment is performed on the two insulating films, so that an insulating film 128 and an insulating film 130 are formed to be planarized and an upper surface of the gate electrode 110 is exposed.

As each of the insulating film 128 and the insulating film 130, as a typical example, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating film 128 and the insulating film 130 can be formed by a plasma-enhanced CVD method, a sputtering method, or the like.

Alternatively, an organic material such as polyimide, an acrylic resin, or a benzocyclobutene-based resin can be used. Other than such organic materials, it is also possible to use a low dielectric constant material (low-k material) or the like. In the case of using an organic material, the insulating film 128 and the insulating film 130 may be formed by a wet method such as a spin coating method or a printing method.

In the insulating film 130, a silicon oxide film is used as the film to be in contact with the semiconductor film.

In this embodiment, a 50 nm thick silicon oxynitride film is formed as the insulating film 128 by a sputtering method, and a 550 nm thick silicon oxide film is formed as the insulating film 130 by a sputtering method.

Oxide semiconductor films with energy gaps different from each other are stacked over the insulating film 130 which is sufficiently planarized by the CMP treatment. In this embodiment, an In—Sn—Zn-based oxide layer and an In—Ga—Zn-based oxide layer are stacked in this order over the insulating film 130 by a sputtering method as the stack of the oxide semiconductor films.

Next, the stacked oxide semiconductor films are subjected to heat treatment and a mixed region is formed between the stacked oxide semiconductor films. When the mixed region is provided, a region between stacked oxide semiconductor layers has a continuous energy band in the energy band diagram, and scattering in the interface between the respective stacked oxide semiconductor layers can be suppressed.

Next, the stack of the oxide semiconductor films is selectively etched to form an island-shaped oxide semiconductor stack 144 including the mixed region. Note that the heat treatment for forming the mixed region in the oxide semiconductor stack 144 may be performed after the oxide semiconductor films are processed into the island-shaped oxide semiconductor stack.

Over the oxide semiconductor stack 144, a source and drain electrodes 142a and 142b are formed.

Over the oxide semiconductor films, a gate insulating film 146 and a gate electrode layer 148 are formed. The gate electrode layer 148 can be formed by forming a conductive layer and selectively etching the conductive layer.

For the gate insulating film 146, a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a gallium oxide film can be formed by a plasma-enhanced CVD method, a sputtering method, or the like.

The conductive layers which can be used for the gate electrode 110 and the source and drain electrodes 142a and 142b can be formed by a PVD method such as a sputtering method or a CVD method such as a plasma-enhanced CVD method. Further, as a material of the conductive layers, an element selected from Al, Cr, Cu, Ta, Ti, Mo, and W, an alloy containing any of the above elements as its component, or the like can be used. Any of Mn, Mg, Zr, Be, Nd, and Sc, or a material containing any of these in combination may be used.

The conductive layer may have a single-layer structure or a layered structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. A conductive layer having a single-layer structure of a titanium film or a titanium nitride film has an advantage in that it can be easily processed into the source and drain electrodes 142a and 142b having a tapered shape.

Next, an insulating film 150 is formed over the oxide semiconductor stack 144, the gate insulating film 146, and the gate electrode layer 148. In this embodiment, an aluminum film is formed as the insulating film 150.

The aluminum oxide film which is provided as the insulating film 150 over the oxide semiconductor stack 144 has a high blocking effect by which both of oxygen and impurities such as hydrogen or moisture is prevented from being permeated through the film.

Therefore, in and after the manufacturing process, the aluminum oxide film functions as a protective film for preventing entry of an impurity which causes a change, such as hydrogen or moisture, into the oxide semiconductor stack 144, and for preventing release of oxygen, which is a main constituent material of the oxide semiconductor, from the oxide semiconductor stack 144.

Another insulating film may be stacked over the insulating film 150.

As the insulating film, a silicon oxide film, a silicon nitride film, a silicon oxynitride film, a silicon nitride oxide film, an aluminum nitride film, an aluminum oxide film, an aluminum oxynitride film, an aluminum nitride oxide film, a hafnium oxide film, and a gallium oxide film can be formed by a plasma-enhanced CVD method, a sputtering method, or the like.

Over the insulating film 150, an electrode layer 153 is formed in a region which overlaps with the source or drain electrode 142a.

Next, an insulating film 152 is formed over the transistor 162 and the electrode layer 153. The insulating film 152 can be formed by a sputtering method, a CVD method, or the like. The insulating film 152 can be formed using a material including an inorganic insulating material such as silicon oxide, silicon oxynitride, silicon nitride, hafnium oxide, or aluminum oxide. In addition, the insulating film 152 can be formed using an organic material such as polyimide, an acrylic resin, or a benzocyclobutene-based resin by a wet method such as a coating method, a printing method, or an ink jet method.

Next, an opening reaching the source or drain electrode 142b is formed in the gate insulating film 146, the insulating film 150, and the insulating film 152. The opening is formed by selective etching with the use of a mask or the like.

After that, a wiring 156 is formed in the opening to be in contact with the source or drain electrode 142b. A connection point of the source or drain electrode 142b and the wiring 156 is not illustrated in FIGS. 15A to 15C.

The wiring 156 is formed in a manner such that a conductive layer is formed by a PVD method such as a sputtering method or a CVD method such as a plasma-enhanced CVD method and then the conductive layer is etched. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used. The details are the same as the details of the source electrode or drain electrode 142a.

Through the above-described process, the transistor 162 and the capacitor 164 are formed. In this embodiment, the transistor 162 is a transistor including the oxide semiconductor stack 144 which includes at least two oxide semiconductor layers with energy gaps different from each other and a mixed region between the stacked oxide semiconductor layers. As a semiconductor layer, the oxide semiconductor stack 144 includes a plurality of oxide semiconductor layers with energy gaps different from each other, whereby electric characteristics of the transistor 162 can be accurately controlled, and accordingly desired electric characteristics can be given to the transistor 162. Further, in this embodiment, the oxide semiconductor stack 144, which is highly purified, contains excess oxygen that repairs an oxygen vacancy. Therefore, the transistor 162 has reduced off-state current and less change in electric characteristics; thus, the transistor 162 is electrically stable. The capacitor 164 includes the source or drain electrode 142a, the gate insulating film 146, and the electrode layer 153.

The gate insulating film 146 and the insulating film 150 are stacked in the capacitor 164 in FIGS. 15A to 15C, whereby the insulation between the source or drain electrode 142a and the electrode layer 153 can be sufficiently provided. It is needless to say that the capacitor 164 without the insulating film 150 may be employed in order to secure sufficient capacitance. The capacitor 164 may have a structure including an insulating film. Further alternatively, the capacitor 164 may be omitted in the case where a capacitor is not necessary.

FIG. 15C is an example of a diagram of a circuit using the semiconductor device as a memory element. In FIG. 15C, one of a source electrode and a drain electrode of the transistor 162, one electrode of the capacitor 164, and a gate electrode of the transistor 140 are electrically connected to one another. A first wiring (1st Line, also referred to as a source line) is electrically connected to a source electrode of the transistor 140. A second wiring (2nd Line, also referred to as a bit line) is electrically connected to a drain electrode of the transistor 140. A third wiring (3rd Line, also referred to as a first signal line) is electrically connected to the other of the source electrode and the drain electrode of the transistor 162. A fourth wiring (4th Line, also referred to as a second signal line) is electrically connected to a gate electrode of the transistor 162. A fifth wiring (5th Line, also referred to as a word line) and the other electrode of the capacitor 164 are electrically connected to each other.

The transistor 162 including an oxide semiconductor has extremely small off-state current; therefore, by turning the transistor 162 off, the potential of a node (hereinafter a node FG) where the one of the source electrode and the drain electrode of the transistor 162, the one electrode of the capacitor 164, and the gate electrode of the transistor 140 are electrically connected to one another can be held for an extremely long time. The capacitor 164 facilitates holding of charge given to the node FG and reading of the held data.

To store data in the semiconductor device (in writing of data), the potential of the fourth wiring is set to a potential at which the transistor 162 is turned on, whereby the transistor 162 is turned on. Thus, the potential of the third wiring is supplied to the node FG, so that a predetermined amount of charge is accumulated in the node FG. Here, charge for supplying either of two different potential levels (hereinafter referred to as low-level charge and high-level charge) is given to the node FG. After that, the potential of the fourth wiring is set to a potential at which the transistor 162 is turned off, whereby the transistor 162 is turned off. This makes the node FG floating and the predetermined amount of charge is kept being held in the node FG. The predetermined amount of charge is thus accumulated and held in the node FG, whereby the memory cell can store data.

Since the off-state current of the transistor 162 is controlled to be extremely small, the charge supplied to the node FG is held for a long period. Thus, the refresh operation is not necessary or the frequency of the refresh operation can be extremely reduced, which leads to a sufficient reduction in power consumption. Further, stored data can be held for a long time even when power is not supplied.

To read out stored data (in reading of data), while a predetermined potential (a fixed potential) is supplied to the first wiring, an appropriate potential (a read-out potential) is supplied to the fifth wiring, whereby the transistor 140 changes its state depending on the amount of charge held in the node FG. This is because in general, when the transistor 140 is an n-channel transistor, an apparent threshold value $V_{th\_H}$ of the transistor 140 in the case where the high-level charge is held in the node FG is smaller than an apparent threshold value $V_{th\_L}$ of the transistor 140 in the case where the low-level charge is held in the node FG Here, each apparent threshold voltage refers to the potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined. For example, in the case where the high-level electric charge is given in data writing, when the potential of the fifth wiring is $V_0$ ($>V_{th\_H}$), the transistor 140 is turned on. In the case where the low-level electric charge is given in writing, even when the potential of the fifth wiring is $V_0$ ($<V_{th\_L}$), the transistor 140 remains in an off state. Therefore, by controlling the potential of the fifth wiring and determining whether the transistor 140 is in an on state or off state (reading out the potential of the second wiring), stored data can be read out.

Further, in order to rewrite stored data, the next potential is supplied to the node FG that is holding the predetermined amount of charge given in the above data writing, so that the charge of the next data is held in the node FG. Specifically, the potential of the fourth wiring is set to a potential at which the transistor 162 is turned on, whereby the transistor 162 is turned on. The potential of the third wiring (potential of the next data) is supplied to the node FG, and the predetermined amount of charge is accumulated in the node FG. After that, the potential of the fourth wiring is set to a potential at which the transistor 162 is turned off, whereby the transistor 162 is turned off. Accordingly, the charge of the next data is held in the node FG. In other words, while the predetermined amount of charge given in the first writing is held in the node FG, an operation (second writing) is performed in the same manner as the first writing, whereby data can be overwritten to be stored.

The transistor 162 described in this embodiment is a transistor including the oxide semiconductor stack which includes at least two oxide semiconductor layers with energy gaps different from each other and is controlled to have sufficiently small off-state current. By using such a transistor, a semiconductor device in which stored data can be held for an extremely long time can be provided.

As described above, an oxide semiconductor stack includes a plurality of oxide semiconductor layers with energy gaps different from each other and a mixed region between the plurality of oxide semiconductor layers, whereby electric characteristics of a transistor can be accurately controlled, and accordingly desired electric characteristics can be given to the transistor. Accordingly, a semiconductor device which meets various purposes such as high performance, high reliability, and low power consumption can be provided.

The structures, methods, and the like described in this embodiment can be combined as appropriate with any of the structures, methods, and the like described in the other embodiments.

Embodiment 8

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in any of the above embodiment will be described. With the semiconductor devices described in the above embodiments, electric devices which meet various purposes such as high performance, high reliability, and low power consumption can be provided.

Figure 16A:
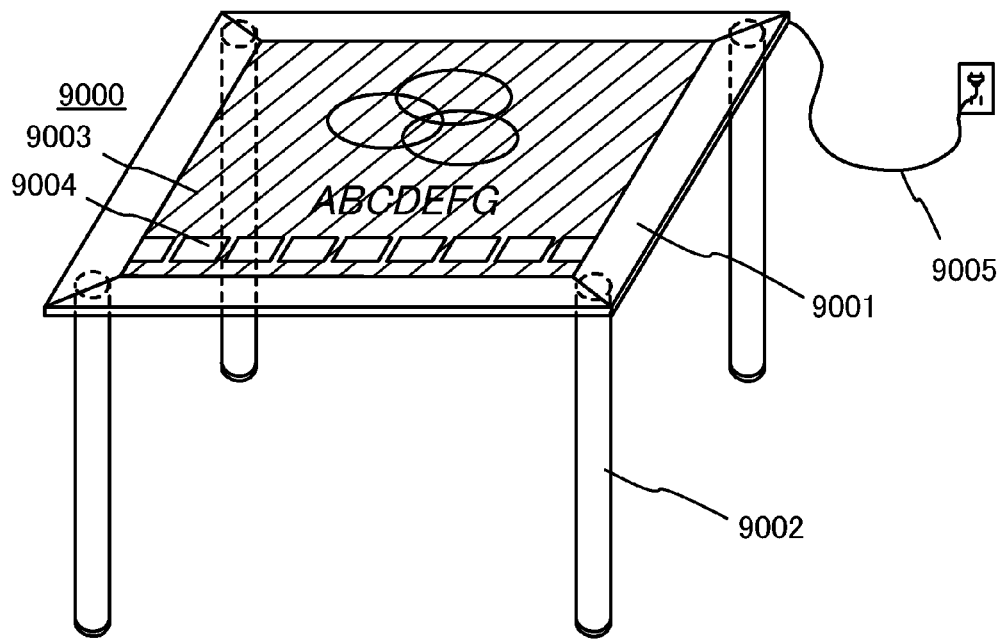
FIGS. 16A to 16D each illustrate an electronic device.

FIG. 16A illustrates a table 9000 having a display portion. In the table 9000, a display portion 9003 is incorporated into a housing 9001. A semiconductor device manufactured according to one embodiment of the present invention can be used for the display portion 9003, and an image can be displayed on the display portion 9003. Note that the housing 9001 is supported by four leg portions 9002. Further, a power cord 9005 for supplying power is provided for the housing 9001.

The display portion 9003 has a touch-input function. When users touch displayed buttons 9004 which are displayed on the display portion 9003 of the table 9000 with their fingers or the like, the users can carry out operation of the screen and input of information. Further, when the table may be made to communicate with home appliances or control the home appliances, the display portion 9003 may function as a control device which controls the home appliances by operation on the screen. For example, with the use of the semiconductor device having an image sensor function described in Embodiment 6, the display portion 9003 can have a touch-input function.

Further, the screen of the display portion 9003 can be placed perpendicular to a floor with a hinge provided for the housing 9001; thus, the table 9000 can also be used as a television set. When a television device having a large screen is set in a small room, an open space is reduced; however, when a display portion is incorporated in the table, a space in the room can be efficiently used.

Figure 16B:
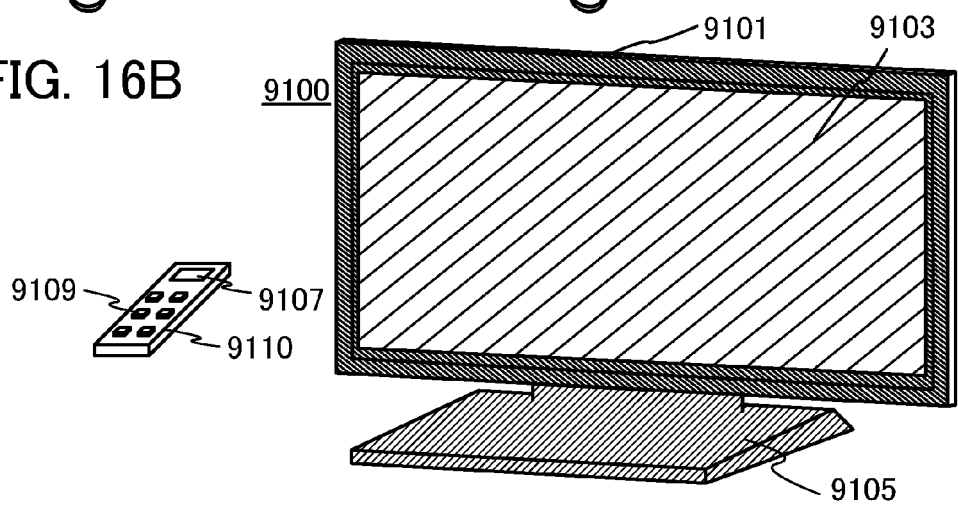

FIG. 16B illustrates a television set 9100. In the television set 9100, a display portion 9103 is incorporated in a housing 9101. A semiconductor device manufactured according to one embodiment of the present invention can be used for the display portion 9103, and an image can be displayed on the display portion 9103. Note that the housing 9101 is supported by a stand 9105.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 16B is provided with a receiver, a modem, and the like. With the receiver, the television set 9100 can receive a general television broadcast. Further, when the television set 9100 is connected to a communication network with or without wires connection via the modem, one-way (from a transmitter to a receiver) or two-way (between a transmitter and a receiver or between receivers) data communication can be performed.

The semiconductor device described in any of Embodiments 1 to 7 is applied to the display portion 9103, whereby a television set having higher performance and higher reliability can be provided.

Figure 16C:
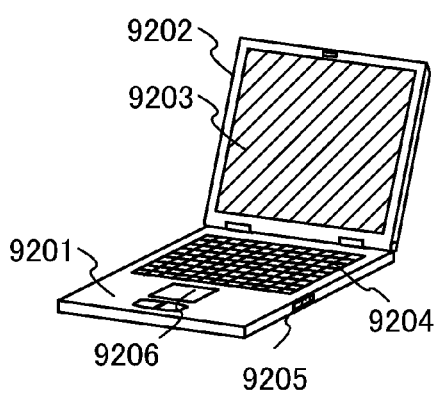

FIG. 16C illustrates a computer, which includes a main body 9201, a housing 9202, a display portion 9203, a keyboard 9204, an external connection port 9205, a pointing device 9206, and the like. The computer is manufactured using a semiconductor device manufactured using one embodiment of the present invention for the display portion 9203.

The semiconductor device described in any of Embodiments 1 to 7 is applied to the display portion 9203, whereby a computer having higher performance and higher reliability can be provided.

Figure 16D:
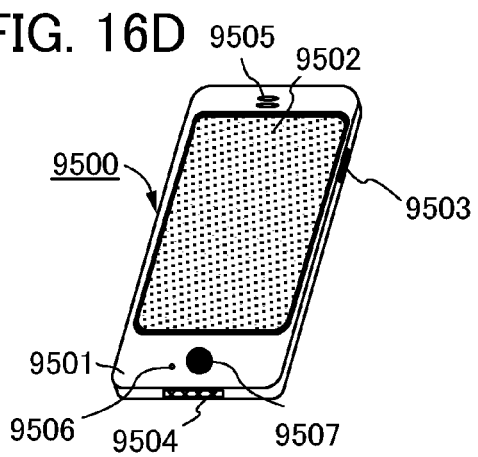

FIG. 16D illustrates an example of a mobile phone. A mobile phone 9500 is provided with a display portion 9502 incorporated in a housing 9501, an operation button 9503, an external connection port 9504, a speaker 9505, a microphone 9506, an operation button 9507, and the like. The semiconductor device described in any of Embodiments 1 to 7 is applied to the display portion 9502, whereby personal digital assistant (PDA) having higher performance and higher reliability can be provided.

Users can input data, make a call, or text a message by touching the display portion 9502 of the mobile phone 9500 illustrated in FIG. 16D with their fingers or the like.

There are mainly three screen modes for the display portion 9502. The first mode is a display mode mainly for displaying images. The second mode is an input mode mainly for inputting data such as text. The third mode is a display-and-input mode in which two modes of the display mode and the input mode are combined.

For example, in the case of making a call or text messaging, a text input mode mainly for inputting text is selected for the display portion 9502 so that characters displayed on a screen can be input. In this case, it is preferable to display a keyboard or number buttons on almost the entire screen of the display portion 9502.

By providing a detection device which includes a sensor for detecting inclination, such as a gyroscope or an acceleration sensor, inside the mobile phone 9500, the direction of the mobile phone 9500 (whether the mobile phone 9500 is placed horizontally or vertically for a landscape mode or a portrait mode) is determined so that display on the screen of the display portion 9502 can be automatically switched.

In addition, the screen mode is switched by touching the display portion 9502 or operating the operation button 9503 of the housing 9501. Alternatively, the screen modes can be switched depending on kinds of images displayed in the display portion 9502. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 9502 is not performed within a specified period of time while a signal detected by an optical sensor in the display portion 9502 is detected, the screen mode may be controlled so as to be switched from the input mode to the display mode.

The display portion 9502 can also function as an image sensor. For example, an image of a palm print, a fingerprint, or the like is taken by touching the display portion 9502 with the palm or the finger, whereby personal authentication can be performed. Further, by providing a backlight or a sensing light source which emits a near-infrared light in the display portion, an image of a finger vein, a palm vein, or the like can be taken.

The structures, methods, and the like described in this embodiment can be combined as appropriate with any of the structures, methods, and the like described in the other embodiments.

Example

In this example, the cross-sectional structure of an oxide semiconductor stack was observed.

A 5-nm-thick In—Ga—Zn-based oxide film, a 5-nm-thick In—Sn—Zn-based oxide film, and a 5-nm-thick In—Ga—Zn-based oxide film were stacked over a quartz substrate, which is a substrate 1000, as a first oxide semiconductor layer 1001, a second oxide semiconductor layer 1002, and a third oxide semiconductor layer 1003, respectively, to form an oxide semiconductor stack as a sample. Each layer was deposited by a sputtering method at a substrate temperature of 300° C. under an oxygen atmosphere (100% oxygen). An oxide target having an atomic ratio of In:Ga:Zn=1:1:1 was used for deposition of each of the In—Ga—Zn-based oxide films and an oxide target having an atomic ratio of In:Sn:Zn=2:1:3 was used for deposition of the In—Sn—Zn-based oxide film.

Next, the oxide semiconductor stack was subjected to heat treatment, so that an oxide semiconductor stack including a mixed region was formed to form an example sample. The heat treatment was performed at 650° C. under a nitrogen atmosphere for 1 hour, and then performed at 650° C. under an oxygen atmosphere for 1 hour. Note that an oxide semiconductor stack which is not subjected to heat treatment was used as a comparative example sample.

Figure 17:
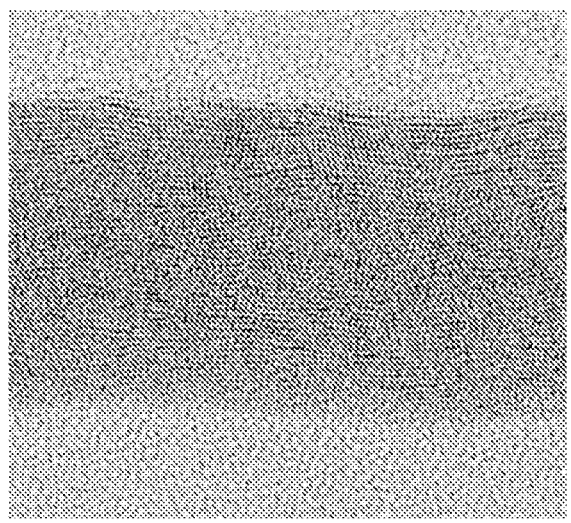
FIG. 17 is a TEM image of an example sample.
Figure 18A:
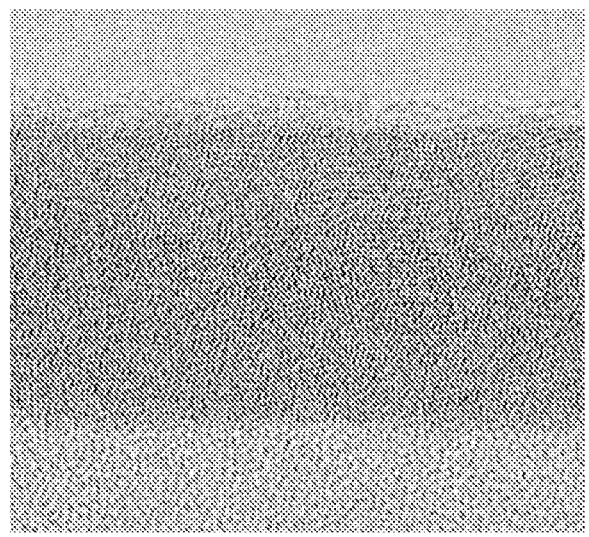
FIGS. 18A and 18B are a TEM image of a comparative example sample and a schematic diagram thereof.
Figure 18B:
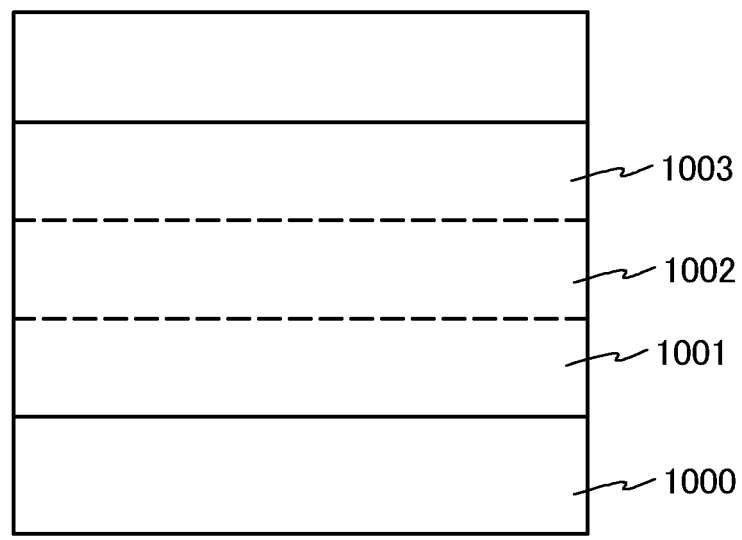

Respective edge sections were cut out of the example sample and the comparative example sample, and cross sections thereof were observed with a high-resolution transmission electron microscopy ("H9000-NAR": TEM manufactured by Hitachi High-Technologies Corporation). FIG. 17 is a TEM image of the example sample, and FIG. 18A is a TEM image of the comparative example sample. A schematic diagram of the comparative example sample is illustrated in FIG. 18B. The boundary between stacked oxide semiconductor layers is shown by a dotted line in FIG. 18B, which is illustrated schematically.

The TEM images of the comparative example sample in FIG. 18A is of the oxide semiconductor stack in which the first 5-nm-thick In—Ga—Zn-based oxide film, the 5-nm-thick In—Sn—Zn-based oxide film, and the second 5-nm-thick In—Ga—Zn-based oxide film were stacked over the substrate 1000 as the first oxide semiconductor layer 1001, the second oxide semiconductor layer 1002, and the third oxide semiconductor layer 1003, respectively. Each boundary (interface) between the stacked oxide semiconductor layers can be recognized in the TEM image of the comparative example sample in FIG. 18A.

On the other hand, in the TEM image of the example sample in which the heat treatment was performed on the oxide semiconductor stack, a clear boundary is not recognized between the stacked oxide semiconductor layers as shown in FIG. 17, and a mixed region is formed.

As shown in FIG. 17 and FIG. 18A, it can be recognized that the first In—Ga—Zn-based oxide film which is the first oxide semiconductor layer 1001, the In—Sn—Zn-based oxide film which is the second oxide semiconductor layer 1002, and the second In—Ga—Zn-based oxide film which is the third oxide semiconductor layer 1003 each include a crystal and are a crystalline oxide semiconductor (CAAC-OS) film having c-axis alignment. The first In—Ga—Zn-based oxide film which is the first oxide semiconductor layer 1001 also includes an amorphous structure.

The crystal state of each oxide semiconductor layer in the oxide semiconductor stack is not particularly limited; each and every oxide semiconductor layer may have a crystal structure or may have an amorphous structure, or both an oxide semiconductor layer having a crustal structure and an oxide semiconductor layer having an amorphous structure may be mixed in the oxide semiconductor stack.

It was confirmed from the above results that an oxide semiconductor stack which included a plurality of oxide semiconductor layers with energy gaps different from one another and a mixed region between the plurality of oxide semiconductor layers was able to be obtained. With the use of the oxide semiconductor stack, electric characteristics of a transistor can be accurately controlled, and accordingly desired electric characteristics can be given to the transistor. Accordingly, by using the transistor, a semiconductor device which meets various purposes such as high performance, high reliability, and low power consumption can be provided.

This application is based on Japanese Patent Application serial No. 2011-152096 filed with the Japan Patent Office on Jul. 8, 2011, the entire contents of which are hereby incorporated by reference.

What is claimed is:

1. A semiconductor device comprising:
    an oxide semiconductor stack layer comprising a first oxide semiconductor layer, a second oxide semiconductor layer, and a third oxide semiconductor layer;
    a source electrode layer and a drain electrode layer over the oxide semiconductor stack layer;
    a gate insulating film over the source electrode layer and the drain electrode layer; and
    a gate electrode layer over the gate insulating film, the gate electrode layer overlapping with the oxide semiconductor stack layer,
    wherein the second oxide semiconductor layer is between the first oxide semiconductor layer and the third oxide semiconductor layer,
    wherein the second oxide semiconductor layer has a smaller energy gap than the first oxide semiconductor layer and the third oxide semiconductor layer,
    wherein a first mixed region whose composition is different from a composition of the first oxide semiconductor layer and a composition of the second oxide semiconductor layer is between the first oxide semiconductor layer and the second oxide semiconductor layer,
    wherein a second mixed region whose composition is different from the composition of the second oxide semiconductor layer and a composition of the third oxide semiconductor layer is between the second oxide semiconductor layer and the third oxide semiconductor layer, and
    wherein the third oxide semiconductor layer covers and is in contact with a side surface of the first oxide semiconductor layer and a top surface and a side surface of the second oxide semiconductor layer.

2. The semiconductor device according to claim 1, wherein an electron affinity of the second oxide semiconductor layer is higher than an electron affinity of the first oxide semiconductor layer and an electron affinity of the third oxide semiconductor layer.

3. The semiconductor device according to claim 1, wherein a region of the oxide semiconductor stack layer, which does not overlap with the source electrode layer or the drain electrode layer, has higher oxygen concentration than a region overlapping with the source electrode layer and the drain electrode layer.

4. The semiconductor device according to claim 1, wherein a region of the oxide semiconductor stack layer, which does not overlap with the gate electrode layer, contains a dopant.

5. The semiconductor device according to claim 1,
    wherein the oxide semiconductor stacked layer comprises a crystal including a c-axis alignment.

6. A semiconductor device comprising:
    an oxide semiconductor stack layer comprising a first oxide semiconductor layer, a second oxide semiconductor layer, and a third oxide semiconductor layer;
    a source electrode layer and a drain electrode layer over the oxide semiconductor stack layer;
    a gate insulating film over the source electrode layer and the drain electrode layer; and
    a gate electrode layer over the gate insulating film, the gate electrode layer overlapping with the oxide semiconductor stack layer,
    wherein the second oxide semiconductor layer is between the first oxide semiconductor layer and the third oxide semiconductor layer,
    wherein the second oxide semiconductor layer has a smaller energy gap than the first oxide semiconductor layer and the third oxide semiconductor layer,
    wherein a first mixed region whose composition is different from a composition of the first oxide semiconductor layer and a composition of the second oxide semiconductor layer is between the first oxide semiconductor layer and the second oxide semiconductor layer,
    wherein a second mixed region whose composition is different from the composition of the second oxide semiconductor layer and a composition of the third oxide semiconductor layer is between the second oxide semiconductor layer and the third oxide semiconductor layer,
    wherein the third oxide semiconductor layer covers and is in contact with a side surface of the first oxide semiconductor layer and a top surface and a side surface of the second oxide semiconductor layer, and
    wherein each of the source electrode layer and the drain electrode layer is in contact with a side surface of the third oxide semiconductor layer.

7. The semiconductor device according to claim 6, wherein an electron affinity of the second oxide semiconductor layer is higher than an electron affinity of the first oxide semiconductor layer and an electron affinity of the third oxide semiconductor layer.

8. The semiconductor device according to claim 6, wherein a region of the oxide semiconductor stack layer, which does not overlap with the source electrode layer or the drain electrode layer, has higher oxygen concentration than a region overlapping with the source electrode layer and the drain electrode layer.

9. The semiconductor device according to claim 6, wherein a region of the oxide semiconductor stack layer, which does not overlap with the gate electrode layer, contains a dopant.

10. The semiconductor device according to claim 6, wherein the oxide semiconductor stacked layer comprises a crystal including a c-axis alignment.

\* \* \* \* \*